(12) United States Patent
Hyun et al.

(10) Patent No.: US 10,109,763 B2
(45) Date of Patent: Oct. 23, 2018

(54) LIGHT-EMITTING DEVICES AND METHODS OF MANUFACTURING THE SAME

(71) Applicant: Samsung Electronics Co., Ltd., Suwon-si, Gyeonggi-do (KR)

(72) Inventors: Jae-sung Hyun, Hwaseong-si (KR); Dong-yul Lee, Yongin-si (KR); Jung-kyu Park, Seoul (KR)

(73) Assignee: Samsung Electronics Co., LTD., Gyeonggi-Do (KR)

( * ) Notice: Subject to any disclaimer, the term of this patent is extended or adjusted under 35 U.S.C. 154(b) by 0 days.

(21) Appl. No.: 15/357,395

(22) Filed: Nov. 21, 2016

(65) Prior Publication Data

US 2017/0263808 A1 Sep. 14, 2017

(30) Foreign Application Priority Data

Mar. 10, 2016 (KR) ........................ 10-2016-0029096

(51) Int. Cl.
*H01L 33/00* (2010.01)

(52) U.S. Cl.
CPC ...... *H01L 33/0062* (2013.01); *H01L 33/0095* (2013.01)

(58) Field of Classification Search
CPC ............................ H01L 33/00; H01L 33/0095
USPC ........................................................ 257/98
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |

(Continued)

FOREIGN PATENT DOCUMENTS

| JP | 2004146605 A | 5/2004 |
| JP | 2011192993 A | 9/2011 |

(Continued)

*Primary Examiner* — Marcos D Pizarro
*Assistant Examiner* — Antonio Crite
(74) *Attorney, Agent, or Firm* — Harness, Dickey & Pierce, P.L.C.

(57) ABSTRACT

A light-emitting device that may be manufactured includes an n-type semiconductor layer including a first dopant on a substrate, an active layer on the n-type semiconductor layer, and a p-type semiconductor layer including a second dopant on the active layer. The light-emitting device may be formed according to at least one of a first layering process and a second layering process. The first layering process may include implanting the first dopant into the n-type semiconductor layer into the n-type semiconductor layer according to an ion-implantation process, and the second layering process may include implanting the second dopant into the p-type semiconductor layer according to an ion-implantation process. Forming a semiconductor layer that includes an ion-implanted dopant may include thermally annealing the semiconductor layer subsequent to the ion implantation. The p-type semiconductor layer may include magnesium-hydrogen (Mg—H) complexes at a concentration of about $1 \times 10^{17}$ atoms/$cm^3$ to about $1 \times 10^{18}$ atoms/$cm^3$.

11 Claims, 43 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,093,597 B2 | 1/2012 | Briere |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,415,682 B2 * | 4/2013 | Nakanishi ........... H01L 21/0242 257/190 |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,778,775 B2 | 7/2014 | Tauzin et al. |
| 8,912,570 B2 * | 12/2014 | Chiang ............. H01L 29/66462 257/192 |
| 8,927,960 B2 | 1/2015 | Kim |
| 8,927,999 B2 | 1/2015 | Kizilyalli et al. |
| 9,129,888 B2 | 9/2015 | Lee et al. |
| 2010/0127298 A1 * | 5/2010 | Yim ........................ H01L 33/46 257/98 |

FOREIGN PATENT DOCUMENTS

| | | |
|---|---|---|
| KR | 101038836 B1 | 6/2011 |
| KR | 20110109432 A | 10/2011 |
| KR | 20120138049 A | 12/2012 |
| KR | 20140013247 A | 2/2014 |

* cited by examiner

LIGHT-EMITTING DEVICES AND METHODS OF MANUFACTURING THE SAME

CROSS-REFERENCE TO RELATED APPLICATION

This application claims the benefit of Korean Patent Application No. 10-2016-0029096, filed on Mar. 10, 2016, in the Korean Intellectual Property Office, the disclosure of which is incorporated herein in its entirety by reference.

BACKGROUND

The inventive concepts relate to light-emitting devices and methods of manufacturing the same, and more particularly, to light-emitting devices including a plurality of Group III-V semiconductor layers and methods of manufacturing the same.

Light-emitting diodes (LED) have been included in various products, including a lighting apparatus and a backlight unit (BLU) of a display device, because the LED has a longer lifespan and lower power consumption than a conventional light source. In general, the LED includes a plurality of Group III-V semiconductor layers and emits light due to recombination between electrons and holes. In some cases, it is difficult to form a plurality of Group III-V semiconductor layers having high crystal quality and thus, luminous efficiency of the LED may be degraded.

SUMMARY

The inventive concepts provide light-emitting devices having high luminous efficiency.

The inventive concepts also provide methods of manufacturing light-emitting devices having high luminous efficiency.

According to some example embodiments of the inventive concepts, a method of manufacturing a light-emitting device may include forming an n-type semiconductor layer, an active layer, and a p-type semiconductor layer on a substrate according to one of a first layering process and a second layering process. The first layering process may include forming an n-type semiconductor layer including an ion-implanted first dopant on a substrate, forming an active layer on the n-type semiconductor layer, and forming a p-type semiconductor layer including a second dopant on the active layer. The second layering process may include forming the n-type semiconductor layer on the substrate, the n-type semiconductor layer including a first dopant, forming the active layer on the n-type semiconductor layer, and forming the p-type semiconductor layer on the active layer, the p-type semiconductor layer including an ion-implanted second dopant.

According to some example embodiments of the inventive concepts, there is provided a light-emitting device. The device may include a substrate, an n-type semiconductor layer on the substrate, the n-type semiconductor layer including a first dopant, an active layer on the n-type semiconductor layer, and a p-type semiconductor layer on the active layer, the p-type semiconductor layer including a second dopant. The p-type semiconductor layer may include magnesium-hydrogen (Mg—H) complexes at a concentration of about $1\times10^{17}$ atoms/cm$^3$ to about $1\times10^{18}$ atoms/cm$^3$.

According to some example embodiments of the inventive concepts, there is provided a light-emitting device. The device may include a substrate, an n-type semiconductor layer on the substrate, the n-type semiconductor layer including a first dopant, an active layer on the n-type semiconductor layer, and a p-type semiconductor layer on the active layer, the p-type semiconductor layer including a second dopant. A first peak concentration of the second dopant in the p-type semiconductor layer may be greater than about $1\times10^{20}$ atoms/cm$^3$.

According to some example embodiments, a method of manufacturing a light-emitting device may include forming a n-type semiconductor layer on a substrate, the n-type semiconductor layer including a first dopant, forming an active layer on the n-type semiconductor layer, and forming a p-type semiconductor layer on the active layer, the p-type semiconductor layer including a second dopant, the second dopant having a peak concentration in the p-type semiconductor layer, the peak concentration being greater than about $1\times10^{20}$ atoms/cm$^3$.

According to some example embodiments, a method of manufacturing a light-emitting device may include forming an n-type semiconductor layer on a substrate, the n-type semiconductor layer including an ion-implanted first dopant, forming an active layer on the n-type semiconductor layer, and forming a p-type semiconductor layer on the active layer, the p-type semiconductor layer including an ion-implanted second dopant.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

The inventive concepts will now be described more fully hereinafter with reference to the accompanying drawings, in which example embodiments of the inventive concepts are shown. A light-emitting device and a display device, which are will be described below, may have various configurations. Herein, only some elements of the light-emitting device and the display device will be presented, and the inventive concepts are not limited thereto.

Figure 1:
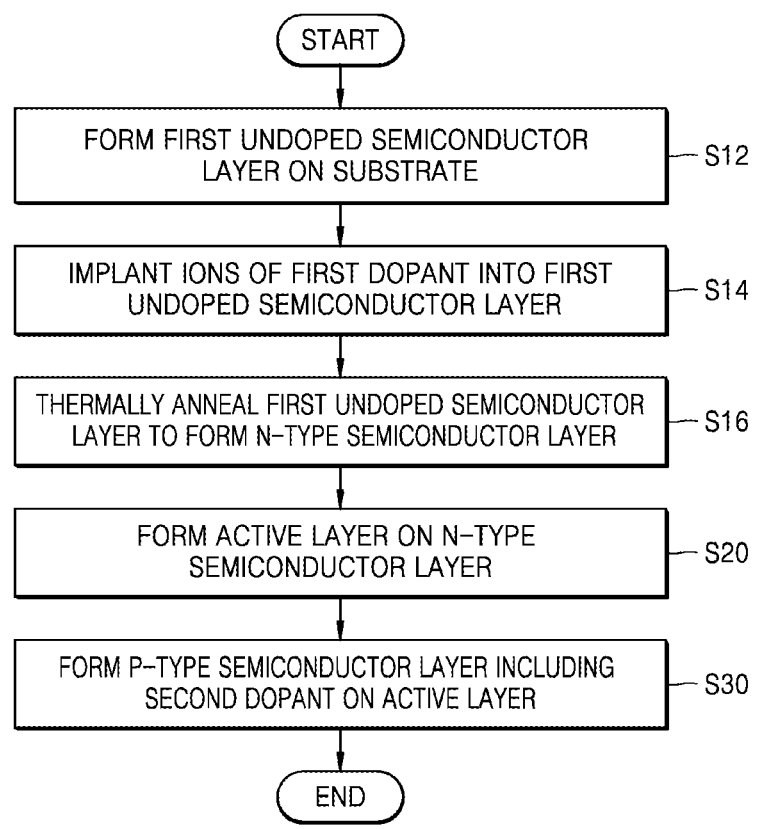
FIG. 1 is a flowchart of a method of manufacturing a light-emitting device according to some example embodiments.

FIG. 1 is a flowchart of a method of manufacturing a light-emitting device according to a first layering process, according to some example embodiments.

FIGS. 2A to 2E are cross-sectional views of sequential process operations of a method of manufacturing a light-emitting device 100 according to the first layering process, according to some example embodiments.

Figure 2A:
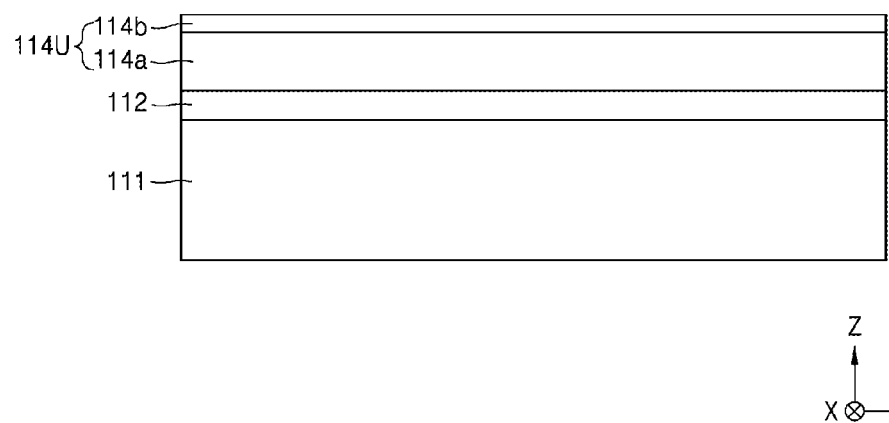
FIGS. 2A-2E are cross-sectional views of sequential process operations of a method of manufacturing a light-emitting device according to some example embodiments.

Referring to FIGS. 1 and 2A, in operation S12, a first undoped semiconductor layer 114U may be formed on a substrate 111.

The substrate 111 may be an insulating substrate, a conductive substrate, or a semiconductor substrate. For example, the substrate 111 may be sapphire (Al2O3), SiC, Si, MgAl$_2$O$_4$, MgO, LiAlO$_2$, LiGaO$_2$, or GaN. However, a kind of the substrate 111 is not limited thereto.

As shown in FIG. 2A, a buffer layer 112 may be formed on the substrate 111. The buffer layer 112 may function as an intermediate layer configured to inhibit generation of crystal defects (e.g., dislocation) due to a difference in lattice constant between the substrate 111 and the first undoped semiconductor layer 114U. In some example embodiments, the buffer layer 112 may function as an intermediate layer configured to generation of stress due to a difference in lattice constant between the substrate 111 and semiconductor layers to be formed on the substrate 111 during subsequent processes or generation of cracks or defects in the semiconductor layers due to the stress.

In some example embodiments, the buffer layer 112 may include a Group III-V semiconductor material including $In_xAl_yGa_{1-x-y}N$ ($0 \le x \le 1$, $0 \le y \le 1$). For example, the buffer layer 112 may include GaN, AlN, AlGaN, or InGaN. In addition, the buffer layer 112 may include $ZrB_2$, $HfB_2$, ZrN, HfN, or TiN. When necessary, the buffer layer 112 may include a plurality of layers including the above-described materials or include a graded layer of which a composition is gradually varied.

In a process of forming the buffer layer 112 according to some example embodiments, the buffer layer 112 may be formed of GaN on the substrate 111 by using a metal-organic chemical vapor deposition (MOCVD) process at a temperature of about 400° C. to about 800° C.

A process of forming the buffer layer 112 according to another embodiment may include forming a first buffer layer (not shown) by using amorphous GaN on the substrate 111 via an MOCVD process at a temperature of about 400° C. to about 800° C., performing an annealing process to change the first buffer layer into a polycrystalline structure, and forming a second buffer layer (not shown) by using GaN on the first buffer layer at a temperature of about 800° C. to about 1100° C. In this case, the buffer layer 112 may include the first buffer layer and the second buffer layer, which are sequentially stacked on the substrate 111.

A process of forming the buffer layer 112 according to another embodiment may include forming a first buffer layer (not shown) by using AlN on the substrate 111 via an MOCVD process at a temperature of about 400° C. to about 1300° C., forming a second buffer layer (not shown) by using $Al_xGa_{1-x}N$ ($0 \le x \le 1$) on the first buffer layer, and forming a third buffer layer (not shown) by using $Al_yGa_{1-y}N$ ($0 \le y \le 1$) on the second buffer layer. In this case, the buffer layer 112 may include first to third buffer layers, which are sequentially stacked on the substrate 111.

A first undoped semiconductor layer 114U may be formed on the buffer layer 112.

In some example embodiments, the first undoped semiconductor layer 114U may include a first semiconductor layer 114a and a second semiconductor layer 114b, which are sequentially stacked on the buffer layer 112. Each of the first semiconductor layer 114a and the second semiconductor layer 114b may include an undoped Group III-V semiconductor material. The Group III-V semiconductor material may include gallium nitride (GaN), indium nitride (InN), $Al_xGa_{1-x}N$ ($0 \le x \le 1$), $In_xGa_{1-x}N$ ($0 \le x \le 1$), $Al_xIn_yGa_{1-x-y}N$ ($0 \le x \le 1$, $0 \le y \le 1$, $0 \le x+y \le 1$), $Al_xIn_yAs_{1-x-y}N$ ($0 \le x \le 1$, $0 \le y \le 1$, $0 \le x+y \le 1$), gallium phosphide (GaP), indium phosphide (InP), $Al_xGa_{1-x}P$ ($0 \le x \le 1$), $In_xGa_{1-x}P$ ($0 \le x \le 1$), $In_xAl_{1-x}P$ ($0 \le x \le 1$), $Ga_xAs_{1-x}P$ ($0 \le x \le 1$), $Al_xGa_yIn_{1-x-y}P$ ($0 \le x \le 1$, $0 \le y \le 1$, $0 \le x+y \le 1$), $Ga_xIn_yAs_{1-x-y}P$ ($0 \le x \le 1$, $0 \le y \le 1$, $0 \le x+y \le 1$), gallium arsenide (GaAs), indium arsenide (InAs), $Al_xGa_{1-x}As$ ($0 \le x \le 1$), $Al_xIn_{1-x}As$ ($0 \le x \le 1$), $In_xGa_{1-x}As$ ($0 \le x \le 1$), $Al_xGa_yIn_{1-x-y}As$ ($0 \le x \le 1$, $0 \le y \le 1$, $0 \le x+y \le 1$), and/or indium antimony (InSb). However, materials included in the first semiconductor layer 114a and the second semiconductor layer 114b are not limited thereto.

In some example embodiments, the first semiconductor layer 114a and the second semiconductor layer 114b may be formed by using an MOCVD process, a metal-organic vapor phase epitaxy (MOVPE) process, a hydride vapor phase epitaxy (HVPE) process, or a molecular beam epitaxy (MBE) process at a temperature of about 800° C. to about 1100° C.

For example, the substrate 111 may be located in a reaction chamber, a reactive gas including a precursor containing a Group III material and a precursor containing a Group V material may be supplied into the reaction chamber at a temperature of about 800° C. to about 1100° C. to grow a GaN material layer on a top surface of the substrate 111.

Thus, the first semiconductor layer 114a or the second semiconductor layer 114b may be formed. In some example embodiments, the precursor may include trimethylgallium (TMG), triethylgallium (TEG), trimethylaluminum (TMA), triethylaluminum (TEA), trimethylindium (TMI), triethylindium (TEI), ethyldimethylindium (EDMIn), ammonia (NH$_3$), and/or dimethylhydrazine (DMHy), but the inventive concepts are not limited thereto.

In some example embodiments, each of the first semiconductor layer 114a and the second semiconductor layer 114b may be formed to a thickness of about 1 μm to about 5 μm. As described above, the first semiconductor layer 114a and the second semiconductor layer 114b may include an undoped Group III-V semiconductor material, and a warpage or a curvature in the substrate 111 on which the first semiconductor layer 114a and the second semiconductor layer 114b are formed may be limited and/or prevented. Characteristics related to the prevention of the curvature in the substrate 111 will be described in detail below with reference to FIGS. 2E and 3.

Figure 2B:
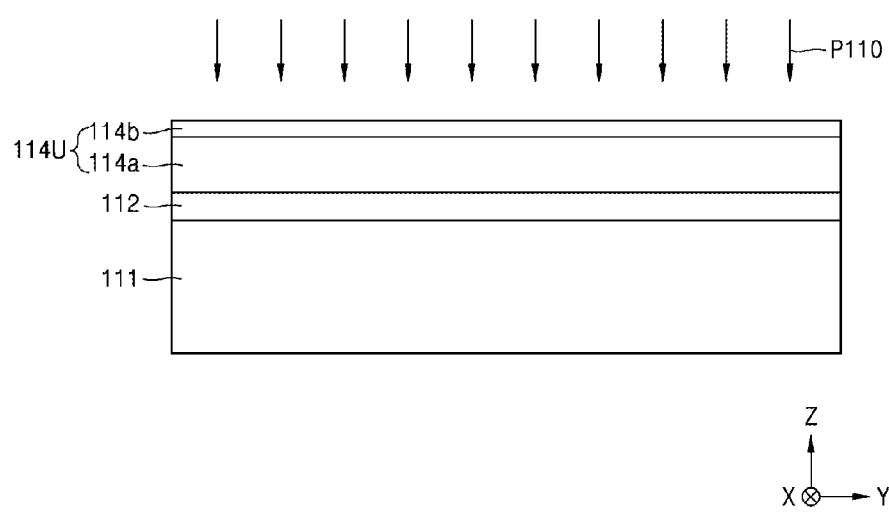

Referring to FIGS. 1 and 2B, in operation S14, ions of a first dopant may be implanted P110 into the first undoped semiconductor layer 114U.

In some example embodiments, a first ion implantation process P110 for implanting the first dopant may be performed on a top surface of the first undoped semiconductor layer 114U. The first dopant may be implanted into the first undoped semiconductor layer 114U and act as a source for providing electrons to an active layer 115 (refer to FIG. 2E).

In some example embodiments, the first dopant may include an n-type dopant, such as silicon (Si) or germanium (Ge). However, a kind of the first dopant is not limited thereto.

Since the first dopant is implanted into the first undoped semiconductor layer 114U due to the first ion implantation process P110, a concentration of the first dopant in the first undoped semiconductor layer 114U may have a Gaussian distribution along a first direction (Z direction in FIG. 2B) that is perpendicular to the top surface of the substrate 111. Here, the Gaussian distribution (or a normal distribution) may have a single peak (i.e., a first peak concentration CP-1 (refer to FIG. 3)) in a first vertical position VP-1 (refer to FIG. 3) located in the first direction.

In some example embodiments, the first dopant may have the first peak concentration CP-1 of, for example, greater than about 1×10$^{18}$ atoms/cm$^3$. For example, the first dopant may have the first peak concentration CP-1 of, for example, about 5×10$^{18}$ atoms/cm$^3$ or the first peak concentration CP-1 of, for example, about 1×10$^{10}$ atoms/cm$^3$. However, the first peak concentration CP-1 of the first dopant according to the inventive concepts is not limited thereto.

In some example embodiments, the first vertical position VP-1 in the first undoped semiconductor layer 114U may vary according to an ion implantation energy and/or ion implantation angle of the first ion implantation process P110. For example, by adjusting the ion implantation energy of the first ion implantation process P110, the first vertical position VP-1 may be located in the first semiconductor layer 114a or located in the second semiconductor layer 114b. For example, by adjusting the ion implantation angle of the first ion implantation process P110, the first vertical position VP-1 may be located near a top surface of the second semiconductor layer 114b. However, the inventive concepts are not limited thereto.

Figure 2C:
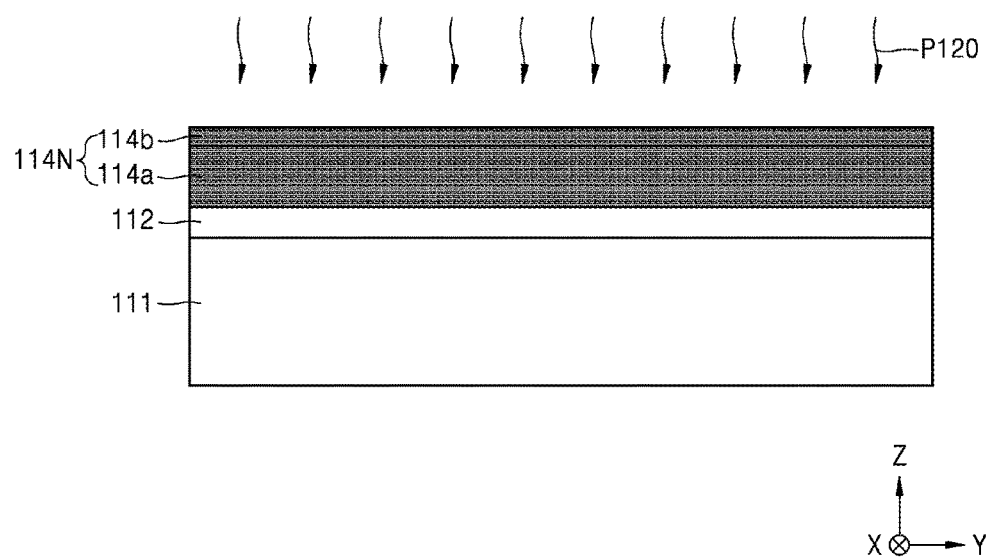

Referring to FIGS. 1 and 2C, in operation S16, the first undoped semiconductor layer 114U (refer to FIG. 2B) may be thermally annealed to form an n-type semiconductor layer 114N.

In some example embodiments, a first thermal annealing process P120 may be performed on the substrate 111 on which the first dopant has been implanted into the first undoped semiconductor layer 114U. Due to the first thermal annealing process P120, sufficient energy for rearranging or diffusing the first dopant implanted into the first undoped semiconductor layer 114U in substitutional sites of the first undoped semiconductor layer 114U may be provided. In addition, due to the first thermal annealing process P120, damage applied to the surface and inside of the first undoped semiconductor layer 114U during the first ion implantation process P110 may be cured.

In some example embodiments, the first thermal annealing process P120 may be performed in a hydrogen atmosphere at a temperature of about 1000° C. to about 1200° C. However, a temperature and atmosphere of the first thermal annealing process P120 are not limited thereto.

Figure 2D:
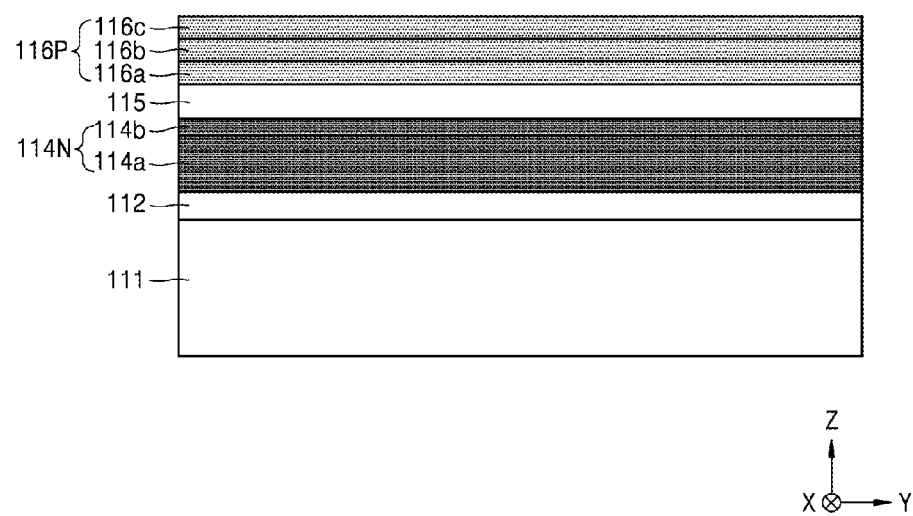

Referring to FIGS. 1 and 2D, in operation S20, the active layer 115 may be formed on the n-type semiconductor layer 114N.

In some example embodiments, the active layer 115 may have a multiple quantum well (MQW) structure formed by alternately stacking a quantum well layer and a quantum barrier layer. For example, the quantum well layer and the quantum barrier layer may include In$_x$Al$_y$Ga$_{1-x-y}$N (0≤x≤1, 0≤y≤1, and 0≤x+y≤1) having different compositions. In embodiments, the quantum well layer may include In$_x$Ga$_{1-x}$N (0≤x≤1), and the quantum barrier layer may include GaN or AlGaN. Each of the quantum well layer and the quantum barrier layer may have a thickness of about 1 nm to about 50 nm. The active layer 115 is not limited to an MQW structure and may have a single quantum well (SQW) structure.

In some example embodiments, the active layer 115 may be formed by using an MOCVD process, an MOVPE process, an HVPE process, or an MBE process at a temperature of about 700° C. to about 1100° C.

Thereafter, in operation S30, a p-type semiconductor layer 116P may be formed on the active layer 115.

In some example embodiments, the p-type semiconductor layer 116P may include a Group III-V semiconductor material into which a second dopant is doped. The Group III-V semiconductor material may include GaN, InN, Al$_x$Ga$_{1-x}$N (0≤x≤1), In$_x$Ga$_{1-x}$N (0≤x≤1), Al$_x$In$_y$Ga$_{1-x-y}$N (0≤x≤1, 0≤y≤1, 0≤x+y≤1), Al$_x$In$_y$As$_{1-x-y}$N (0≤x≤1, 0≤y≤1, 0≤x+y≤1), gallium phosphide (GaP), indium phosphide (InP), Al$_x$Ga$_{1-x}$P (0≤x≤1), In$_x$Ga$_{1-x}$P (0≤x≤1), In$_x$Al$_{1-x}$P (0≤x≤1), Ga$_x$As$_{1-x}$P (0≤x≤1), Al$_x$Ga$_y$In$_{1-x-y}$P (0≤x≤1, 0≤y≤1, 0≤x+y≤1), Ga$_x$In$_y$As$_{1-x-y}$P (0≤x≤1, 0≤y≤1, 0≤x+y≤1), gallium arsenide (GaAs), indium arsenide (InAs), Al$_x$Ga$_{1-x}$As (0≤x≤1), Al$_x$In$_{1-x}$As (0≤x≤1), In$_x$Ga$_{1-x}$As (0≤x≤1), Al$_x$Ga$_y$In$_{1-x-y}$As (0≤x≤1, 0≤y≤1, 0≤x+y≤1), and/or indium antimony (InSb). However, a material included in the p-type semiconductor layer 116P is not limited to the above-described materials.

In some example embodiments, the second dopant may include a p-type dopant, such as magnesium (Mg), beryllium (Be), zinc (Zn), cadmium (Cd), barium (Ba) or calcium (Ca). However, a kind of the second dopant is not limited thereto.

In some example embodiments, the p-type semiconductor layer 116P may be formed by using an MOCVD process, an MOVPE process, an HVPE process, or an MBE process at a temperature of about 800° C. to about 1100° C. The second dopant may be doped in-situ during the formation of the p-type semiconductor layer 116P. For example, after a substrate is located in a reaction chamber, a source gas containing gallium (Ga), a source gas including nitrogen (N), and a source gas including magnesium (Mg) may be supplied into the reaction chamber so that a GaN layer partially doped with magnesium (Mg) may be grown on the substrate. The source gas including magnesium may be MgCp$_2$ or (MeCp)$_2$Mg, but the inventive concepts are not limited thereto.

As shown in FIG. 2D, the p-type semiconductor layer 116P may include a third semiconductor layer 116a and a fourth semiconductor layer 116b, which are sequentially formed on the active layer 115.

In some example embodiments, the third semiconductor layer 116a may be an electron blocking layer EBL, and the fourth semiconductor layer 116b may be a p-type semiconductor layer into which the second dopant is lightly doped.

In some example embodiments, the third semiconductor layer 116a may have a thickness of about 5 nm to about 100 nm and include a stack structure of a plurality of In$_x$Al$_y$Ga$_{1-x-y}$N layers having respectively different compositions or a single Al$_y$Ga$_{1-y}$N layer. In another embodiment, the third semiconductor layer 116a may have a super-lattice structure formed by alternately and repetitively locating an Al$_y$Ga$_{1-y}$N layer and a GaN layer. An energy bandgap Eg of the third semiconductor layer 116a may be reduced away from the active layer 115. The third semiconductor layer 116a may serve as a barrier layer configured to limit and/or prevent emission of electrons from the active layer 115, thereby improving carrier injection efficiency of the light-emitting device 100.

However, a structure of the p-type semiconductor layer 116P is not limited to the above-described structure. Unlike shown in FIG. 2D, the p-type semiconductor layer 116P may have a monolayered structure.

Thereafter, a p-type contact layer 116c may be formed on the p-type semiconductor layer 116P. The p-type contact layer 116c may be a p-type semiconductor layer into which the second dopant is heavily doped.

In some example embodiments, the p-type contact layer 116c may be formed by using an MOCVD process, an MOVPE process, an HVPE process, or an MBE process at a temperature of about 800° C. to about 1100° C. The second dopant may be doped in-situ during the formation of the p-type contact layer 116c.

Figure 2E:
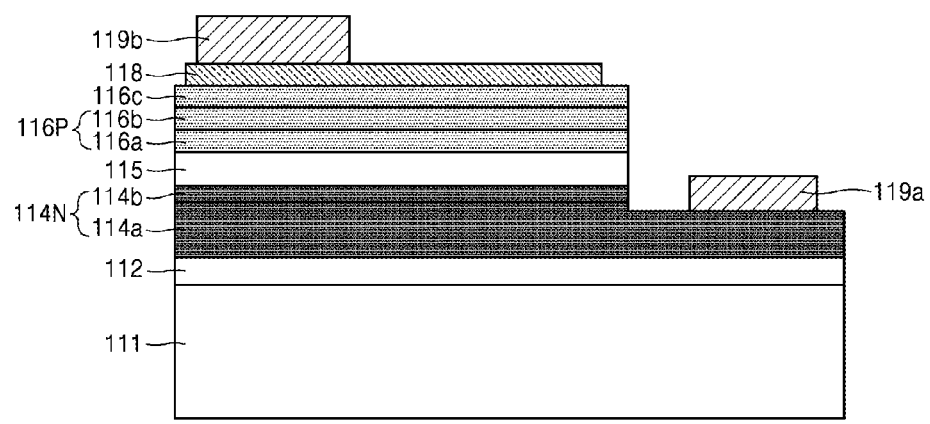

Referring to FIG. 2E, a mesa etching process may be performed on a semiconductor layer stack structure including the n-type semiconductor layer 114N, the active layer 115, the p-type semiconductor layer 116P, and the p-type contact layer 116c to expose a surface of the n-type semiconductor layer 114N. Subsequently, an ohmic contact layer 118 may be formed on the p-type contact layer 116c, and a first electrode 119a and a second electrode 119b may be formed on an exposed surface of the n-type semiconductor layer 114N and the ohmic contact layer 118, respectively, thereby completing the manufacture of the light-emitting device 100.

The first electrode 119a may include, but not limited to, silver (Ag), nickel (Ni), aluminum (Al), chromium (Cr), rhodium (Rh), palladium (Pd), iridium (Ir), ruthenium (Ru), magnesium (Mg), zinc (Zn), platinum (Pt), and/or gold (Au) and adopt a single layer or a single layer or a multi-layered structure including at least two layers. A pad electrode layer may be further provided on the first electrode 119a. The pad electrode layer may include at least one of Au, Ni, and Sn.

The ohmic contact layer 118 may be variously embodied according to a chip structure. For example, in a flip-chip structure, the ohmic contact layer 118 may include a metal, such as silver (Ag), gold (Au), or aluminum (Al), or a transparent conductive oxide, such as indium tin oxide (ITO), zinc indium oxide (ZIO), or gallium indium oxide (GIO). In an inversely disposed structure, the ohmic contact layer 118 may include a transmissive electrode. The transmissive electrode may be any one of a transparent conductive oxide (TCO) layer or a nitride layer. For example, the transmissive electrode may include at least one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), In$_4$Sn$_3$O$_{12}$, and zinc magnesium oxide (Zn$_{1-x}$Mg$_x$O, 0≤x≤1). When necessary, the ohmic contact layer 118 may include graphene. The second electrode 119b may include at least one of aluminum (Al), gold (Au), chromium (Cr), nickel (Ni), titanium (Ti), and tin (Sn).

In general, the formation of the n-type semiconductor layer 114N may be performed by growing a Group III-V semiconductor layer into which an n-type dopant is doped in-situ at a desired (and/or alternatively predetermined) concentration, by using an MOCVD process. For example, after a substrate is located in a reaction chamber, a source gas including gallium (Ga), a source gas including nitrogen (N), and a source gas including silicon (Si) may be supplied into the reaction chamber so that a gallium nitride (GaN) layer partially doped with silicon may be grown on the substrate.

When silicon is doped into substitutional sites in a crystal lattice of the GaN layer, electrons may be provided into the GaN layer. However, when an in-situ doping content of silicon is increased to increase the concentration of electrons in the n-type semiconductor layer, crystal quality of the n-type semiconductor layer may be degraded. For example, a threading dislocation may occur. Thus, optical efficiency of the light-emitting device 100 may be reduced, and a leakage current may be generated.

In addition, when the in-situ doping content of silicon is increased to increase the concentration of electrons in the n-type semiconductor layer, a curvature in the substrate may occur. Accordingly, the entire region of the substrate may have a non-uniform temperature distribution, and/or an active layer formed on the substrate may have a non-uniform composition distribution and a non-uniform crystal-quality distribution.

However, according to the above-described method of manufacturing the light-emitting device 100, the first dopant may be implanted into the first undoped semiconductor layer 114U by using the first ion implantation process P110, and the first thermal annealing process P120 may be performed to rearrange the first dopant in substitutional sites so that the n-type semiconductor layer 114N may be formed. Accordingly, unlike in a typical method of manufacturing an n-type semiconductor layer including a process of doping a first dopant in-situ, degradation of crystal quality of the n-type semiconductor layer may be limited and/or prevented. In addition, unlike in the typical method of manufacturing the p-type semiconductor layer including the process of doping the first dopant in-situ, the curvature in the substrate may be limited and/or prevented so that the active layer 115 having a uniform composition and uniform crystal quality may be formed on the entire region of the substrate 111. Accordingly, the n-type semiconductor layer 114N may have a high dopant content and good crystal quality, and the light-emitting device 100 including the n-type semiconductor layer 114N may have high luminous efficiency.

Hereinafter, a concentration profile of the first dopant in the light-emitting device 100 described with reference to FIGS. 1 to 2E will be described with reference to FIG. 3.

Figure 3:
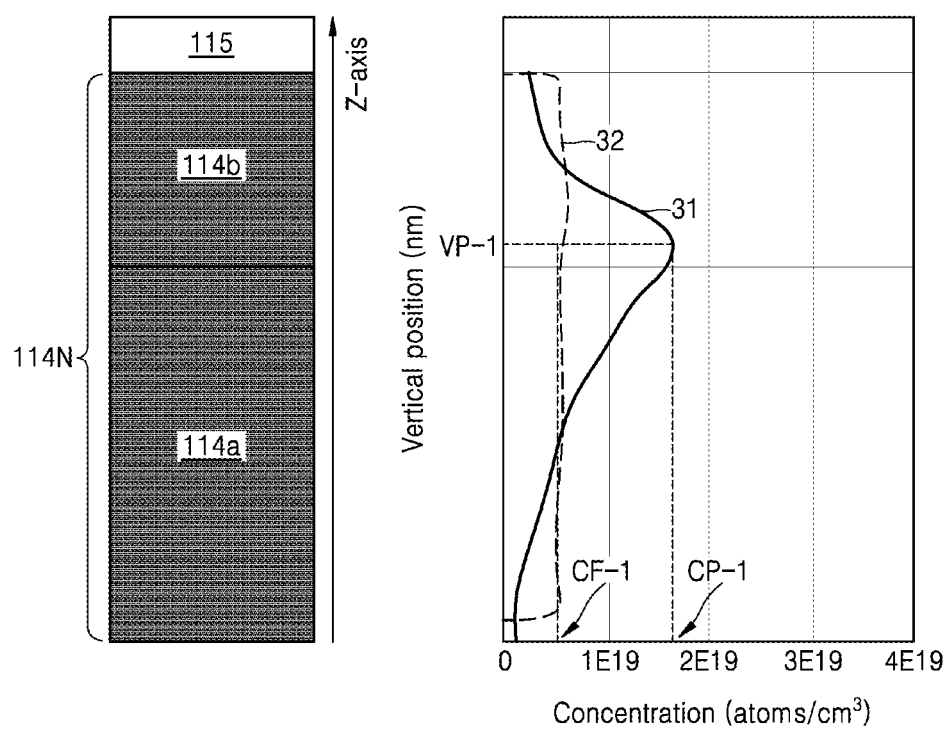
FIG. 3 is a schematic graph of a concentration profile of a first dopant doped into an n-type semiconductor layer according to some example embodiments.

FIG. 3 is a schematic graph of a concentration profile of a first dopant doped into the n-type semiconductor layer 114N, according to some example embodiments. FIG. 3 shows the concentration profile of the first dopant in the n-type semiconductor layer 114N relative to a vertical position along a Z direction (e.g., "first direction") in Embodiment 31 in which the method described with reference to FIGS. 1 to 2E is used. To make comparisons, FIG. 3 also shows a dotted concentration profile of a first dopant in an n-type semiconductor layer in Comparative example 32 in which a typical in-situ doping process is used.

In Embodiment 31, the concentration profile of the first dopant included in the n-type semiconductor layer 114N may have a Gaussian distribution. As shown in FIG. 3, the concentration profile of the first dopant obtained in Embodiment 31 may have a single peak (i.e., the first peak concentration CP-1) in a first vertical position VP-1 in the n-type semiconductor layer 114N along the Z-direction.

The first peak concentration CP-1 may be greater than about $1 \times 10^{18}$ atoms/cm$^3$. For example, the first peak concentration CP-1 may be, for example, greater than about $5 \times 10^{18}$ atoms/cm$^3$ or greater than about $1 \times 10^{19}$ atoms/cm$^3$. FIG. 3 illustrates an example in which the first peak concentration CP-1 is greater than about $1 \times 10^{19}$ atoms/cm$^3$, but the inventive concepts are not limited thereto.

The first vertical position VP-1 may have a variable value in the n-type semiconductor layer 114N. For example, as shown in FIG. 3, the first vertical position VP-1 may be located, in the second semiconductor layer 114b, near an interface between the second semiconductor layer 114b and the first semiconductor layer 114a. In some example embodiments, the first vertical position VP-1 may be located near an interface between the second semiconductor layer 114b and the active layer 115 in the second semiconductor layer 114b. In some example embodiments, the first vertical position VP-1 may be located in the first semiconductor layer 114a.

According to Comparative example 32, the concentration profile of the first dopant included in the n-type semiconductor layer may have a generally flat distribution. The concentration profile of the first dopant according to Comparative example 32 may have a first flat concentration CF-1. The first flat concentration CF-1 may be lower than about $1 \times 10^{19}$ atoms/cm$^3$, for example, lower than about $5 \times 10^{18}$ atoms/cm$^3$.

As described above, it may be necessary to increase a doping content of the first dopant in order to increase the concentration of electrons in the n-type semiconductor layer. However, when an in-situ doping content of the first dopant (e.g., silicon (Si)) increases, an extent to which a curvature in the substrate occurs in a direction perpendicular to the top surface of the substrate during the in-situ doping process may increase with an increase in doping content. As a curvature in the substrate worsens (i.e., as a radius of curvature of the substrate is reduced), a temperature deviation of the substrate may increase during the in-situ doping process. In particular, an active layer formed on the n-type semiconductor layer may include a Group III-V semiconductor material including indium, and indium may be very vulnerable to high temperatures. Accordingly, the temperature deviation of the temperature may increase a composition deviation of indium included in the active layer or a deviation of crystal quality of the active layer. The composition deviation and crystal quality composition of the active layer may lead to a marked reduction in optical efficiency of the light-emitting device. Accordingly, the doping content of the first dopant doped during the in-situ doping process may be limited to the first flat concentration CF-1. According to Comparative example 32, the n-type semiconductor layer may include the first dopant in a relatively low content throughout the entire vertical position thereof.

However, according to the method described with reference to FIGS. 1 to 2E, after the first undoped semiconductor layer 114U is formed, the n-type semiconductor layer 114N may be formed by using the first ion implantation process P110 and the subsequent first thermal annealing process P120. Thus, according to Embodiment 31, the first dopant, which is implanted during the first ion implantation process P110, may have a relatively high first peak concentration CP-1. For example, the first peak concentration CP-1 may be greater than about $5 \times 10^{18}$ atoms/cm$^3$, for example, greater than about $1 \times 10^{19}$ atoms/cm$^3$. A value of the first peak concentration CP-1 may be much greater than the first flat concentration CF-1 according to Comparative example 32. Thus, the content of the first dopant doped into the n-type semiconductor layer 114N may greatly increase, thereby improving luminous efficiency of a light-emitting device. Also, a curvature in the substrate or a deviation of crystal quality of the active layer due to the curvature in the substrate, which may occur during an in-situ doping process, may be limited and/or prevented.

Furthermore, the first vertical position VP-1 having the first peak concentration CP-1 may vary according to a kind and structure of a light-emitting device, a stack structure of the n-type semiconductor layer 114N, and efficiency of injection of carriers from the n-type semiconductor layer 114N into the active layer 115. Accordingly, flexibility for embodying light-emitting devices having high luminous efficiency may be raised.

In conclusion, in the light-emitting device 100 manufactured by using the method described with reference to FIGS. 1 to 2E, the n-type semiconductor layer 114N may include the first dopant in a high content and have good crystal quality, and the light-emitting device 100 including the n-type semiconductor layer 114N may have high luminous efficiency.

Figure 4:
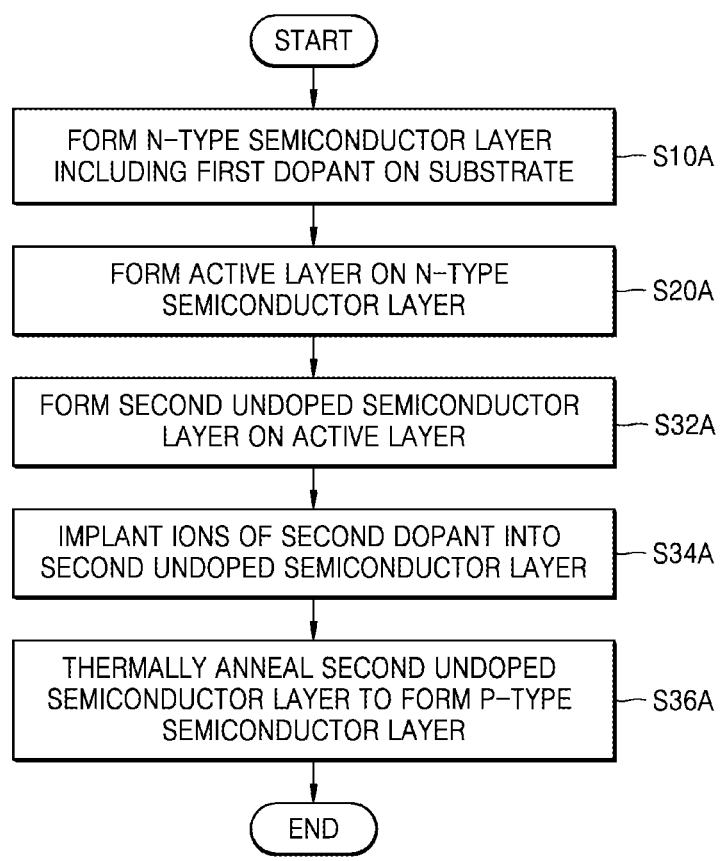
FIG. 4 is a flowchart of a method of manufacturing a light-emitting device according to some example embodiments.

FIG. 4 is a flowchart of a method of manufacturing a light-emitting device according to a second layering process, according to some example embodiments.

FIGS. 5A to 5E are cross-sectional views of sequential process operations of a method of manufacturing a light-emitting device 100A according to the second layering process, some example embodiments. In FIGS. 5A to 5E, the same reference numerals are used to denote the same elements as in FIGS. 1 to 3.

Figure 5A:
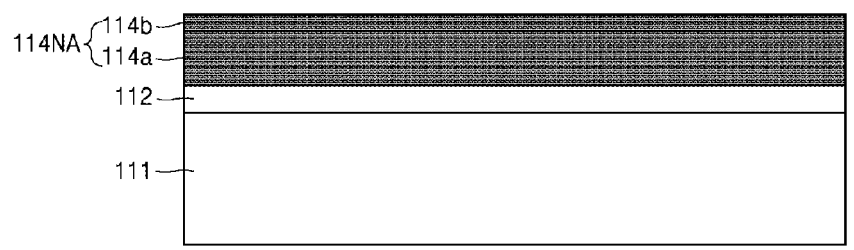
FIGS. 5A-5E are cross-sectional views of sequential process operations of a method of manufacturing a light-emitting device according to some example embodiments.
Figure 5A:
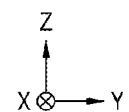

Referring to FIGS. 4 and 5A, in operation S10A, an n-type semiconductor layer 114NA may be formed on a substrate 111.

In some example embodiments, a buffer layer 112 may be formed on the substrate 111, and the n-type semiconductor layer 114NA may be formed on the buffer layer 112. The buffer layer 112 may have similar characteristics to those of the buffer layer 112 described with reference to FIG. 2A.

In some example embodiments, the n-type semiconductor layer 114NA may include a Group III-V semiconductor material into which a first dopant is doped. The Group III-V semiconductor material may have similar characteristics to those of the Group III-V semiconductor material described with reference to FIG. 2A. The first dopant may be silicon (Si) or germanium (Ge).

In some example embodiments, the n-type semiconductor layer 114NA may be formed by using an MOCVD process, an MOVPE process, an HVPE process, or an MBE process at a temperature of about 1000° C. to about 1200° C. The first dopant may be doped in-situ during the formation of the n-type semiconductor layer 114NA. For example, after a substrate is located in a reaction chamber, a gallium (Ga)-containing source gas, a nitrogen (N)-containing source gas, and a silicon (Si)-containing source gas may be supplied into the reaction chamber so that a gallium nitride (GaN) layer partially doped with silicon (Si) may be grown on the substrate. The silicon-containing source gas may be monosilane ($SiH_4$) or disilane ($Si_2H_6$), but the inventive concepts are not limited thereto.

Figure 5B:
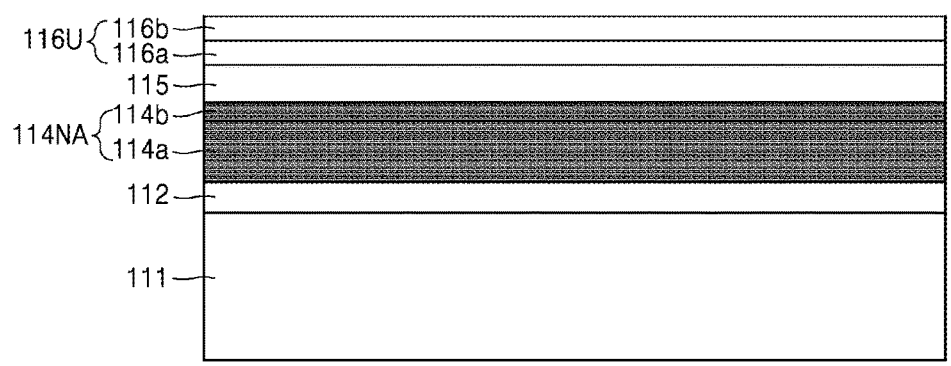

Referring to FIGS. 4 and 5B, in operation S20A, an active layer 115 may be formed on the n-type semiconductor layer 114NA. The active layer 115 may have similar characteristics to those of the active layer 115 described with reference to FIG. 2D.

Thereafter, in operation S32A, a second undoped semiconductor layer 116U may be formed on the active layer 115.

In some example embodiments, the second undoped semiconductor layer 116U may include third and fourth semiconductor layers 116a and 116b, which are sequentially stacked on the active layer 115. The third and fourth semiconductor layers 116a and 116b may include an undoped Group III-V semiconductor material. The Group III-V semiconductor material may include GaN, InN, $Al_xGa_{1-x}N$ (0≤x≤1), $In_xGa_{1-x}N$ (0≤x≤1), $Al_xIn_yGa_{1-x-y}N$ (0≤x≤1, 0≤y≤1, 0≤x+y≤1), $Al_xIn_yAs_{1-x-y}N$ (0≤x≤1, 0≤y≤1, 0≤x+y≤1), gallium phosphide (GaP), indium phosphide (InP), $Al_xGa_{1-x}P$ (0≤x≤1), $In_xGa_{1-x}P$ (0≤x≤1), $In_xAl_{1-x}P$ (0≤x≤1), $Ga_xAs_{1-x}P$ (0≤x≤1), $Al_xGa_yIn_{1-x-y}P$ (0≤x≤1, 0≤y≤1, 0≤x+y≤1), $Ga_xIn_yAs_{1-x-y}P$ (0≤x≤1, 0≤y≤1, 0≤x+y≤1), gallium arsenide (GaAs), indium arsenide (InAs), $Al_xGa_{1-x}As$ (0≤x≤1), $Al_xIn_{1-x}As$ (0≤x≤1), $In_xGa_{1-x}As$ (0≤x≤1), $Al_xGa_yIn_{1-x-y}As$ (0≤x≤1, 0≤y≤1, 0≤x+y≤1), and/or indium antimony (InSb). However, materials included in the third and fourth semiconductor layers 116a and 116b are not limited to the above-described materials.

Figure 5C:
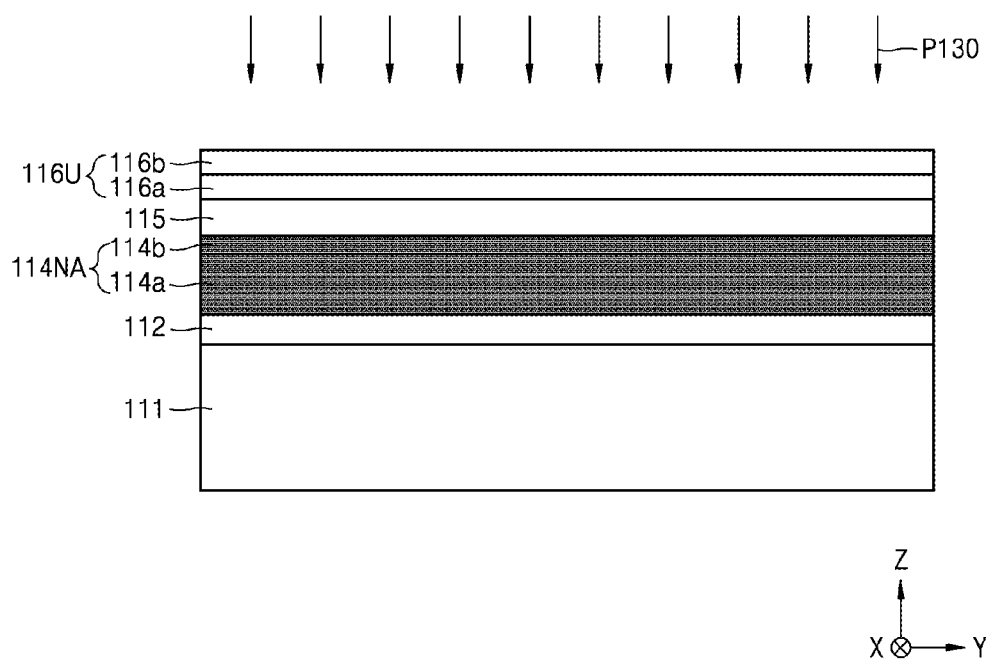

Referring to FIGS. 4 and 5C, in operation S34A, ions of a second dopant may be implanted into the second undoped semiconductor layer 116U.

In some example embodiments, a second ion implantation process P130 for implanting the second dopant may be performed on a top surface of the second undoped semiconductor layer 116U. The second dopant may be implanted into the second undoped semiconductor layer 116U and function as a source for providing holes to the active layer 115.

In some example embodiments, the second dopant may include a p-type dopant, such as magnesium (Mg), beryllium (Be), zinc (Zn), cadmium (Cd), barium (Ba) or calcium (Ca). However, a kind of the second dopant is not limited thereto.

Since the second dopant is implanted into the second undoped semiconductor layer 116U due to the second ion implantation process P130, a concentration of the second dopant in the second undoped semiconductor layer 116U may have a Gaussian distribution in ("along") the first direction (Z direction in FIG. 5C) that is perpendicular to a top surface of the substrate 111. Here, the Gaussian distribution (or a normal distribution) may have a single peak (i.e., a second peak concentration CP-2 (refer to FIG. 6)) in a second vertical position VP-2 in the second undoped semiconductor layer 116U (refer to FIG. 6) along the first direction.

In some example embodiments, the second dopant may have the second peak concentration CP-2 of, for example, greater than about $1 \times 10^{19}$ atoms/$cm^3$. For example, the second dopant may have the second peak concentration CP-2 that is greater than about $5 \times 10^{19}$ atoms/$cm^3$ or have the second peak concentration CP-2 that is greater than about $1 \times 10^{20}$ atoms/$cm^3$. However, the second peak concentration CP-2 of the second dopant according to the inventive concepts is not limited thereto.

In some example embodiments, the second vertical position VP-2 may vary according to an ion implantation energy and/or an ion implantation angle of the second ion implantation process P130 in the second undoped semiconductor layer 116U. For example, by adjusting the ion implantation energy of the second ion implantation process P130, the second vertical position VP-2 may be located near an interface between the fourth semiconductor layer 116b and the third semiconductor layer 116a in the fourth semiconductor layer 116b. In some example embodiments, the second vertical position VP-2 may be located near a top surface of the fourth semiconductor layer 116b. For example, by adjusting an ion implantation angle of the second ion implantation process P130, the second vertical position VP-2 may be located near the top surface of the fourth semiconductor layer 116b. However, the inventive concepts are not limited thereto.

Figure 5D:
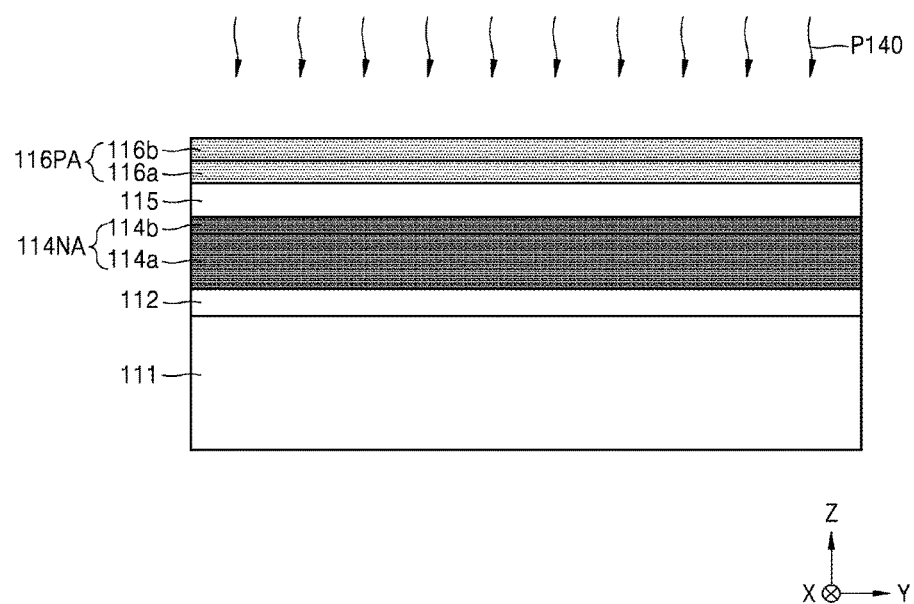

Referring to FIGS. 4 and 5D, in operation S36A, the second undoped semiconductor layer 116U (refer to FIG. 5C) may be thermally annealed to form a p-type semiconductor layer 116PA.

In some example embodiments, a second thermal annealing process P140 may be performed on the second undoped semiconductor layer 116U into which the second dopant is implanted. Due to the second thermal annealing process P140, sufficient energy for rearranging the second dopant injected into the second undoped semiconductor layer 116U in the second undoped semiconductor layer 116U may be provided. Also, due to the second thermal annealing process P140, damage applied to the surface and inside of the second undoped semiconductor layer 116U during the second ion implantation process P130 may be cured.

In some example embodiments, the second thermal annealing process P140 may be performed in a nitrogen atmosphere at a temperature of about 800° C. to about 1100° C. When the second thermal annealing process P140 is performed at an excessively low temperature, the second dopant may not be rearranged in substitutional sites in a crystal lattice of the second undoped semiconductor layer 116U. When the second thermal annealing process P140 is performed at an excessively high temperature, high-temperature damages may be applied to the active layer 115 located under the second undoped semiconductor layer 116U or the second dopant may diffuse into the active layer 115 located under the second undoped semiconductor layer 116U. Thus, luminous efficiency of the active layer 115 may be reduced. However, a temperature and atmosphere of the second thermal annealing process P140 are not limited thereto.

As shown in FIG. 5D, the p-type semiconductor layer 116PA may include a third semiconductor layer 116a and a fourth semiconductor layer 116b, which are sequentially stacked on the active layer 115. Each of the third semiconductor layer 116a and the fourth semiconductor layer 116b may include a Group III-V semiconductor material into which the second dopant is doped. In some example embodiments, the third semiconductor layer 116a may be an electron blocking layer (EBL). The fourth semiconductor layer 116b may be a p-type semiconductor layer into which the second dopant is doped. A concentration profile of the second dopant in the p-type semiconductor layer 116PA may have a Gaussian distribution in the first direction (Z direction in FIG. 5D) that is perpendicular to a top surface of the substrate 111.

In some example embodiments, the p-type semiconductor layer 116PA may contain Mg—H complexes at a relatively low concentration. For example, when the second dopant implanted into the p-type semiconductor layer 116PA contains Mg, the p-type semiconductor layer 116PA may contain Mg—H complexes at a concentration of about $1\times10^{17}$ atoms/cm$^3$ to about $5\times10^{18}$ atoms/cm$^3$. In some embodiments, the p-type semiconductor layer 116PA may contain Mg—H complexes at a concentration of about $1\times10^{17}$ atoms/cm$^3$ to about $1\times10^{18}$ atoms/cm$^3$. In general, when the Mg dopant is doped by using an in-situ doping process during a process of forming the p-type semiconductor layer 116PA, hydrogen (H) atoms generated by pyrolysis of ammonia (NH$_3$) gas, which is a nitrogen (N) precursor, may combine with Mg to form Mg—H complexes. When the Mg—H complexes are contained in the p-type semiconductor layer 116PA at a high concentration of, for example, about $1\times10^{19}$ atoms/cm$^3$ to about $5\times10^{20}$ atoms/cm$^3$, a degree of hole activation (or hole generation efficiency) may be reduced and thus, luminous efficiency of a light-emitting device may be lowered. However, in embodiments, when the p-type semiconductor layer 116PA contains the Mg—H complexes at a relatively low concentration, the degree of hole activation may be improved.

Figure 5E:
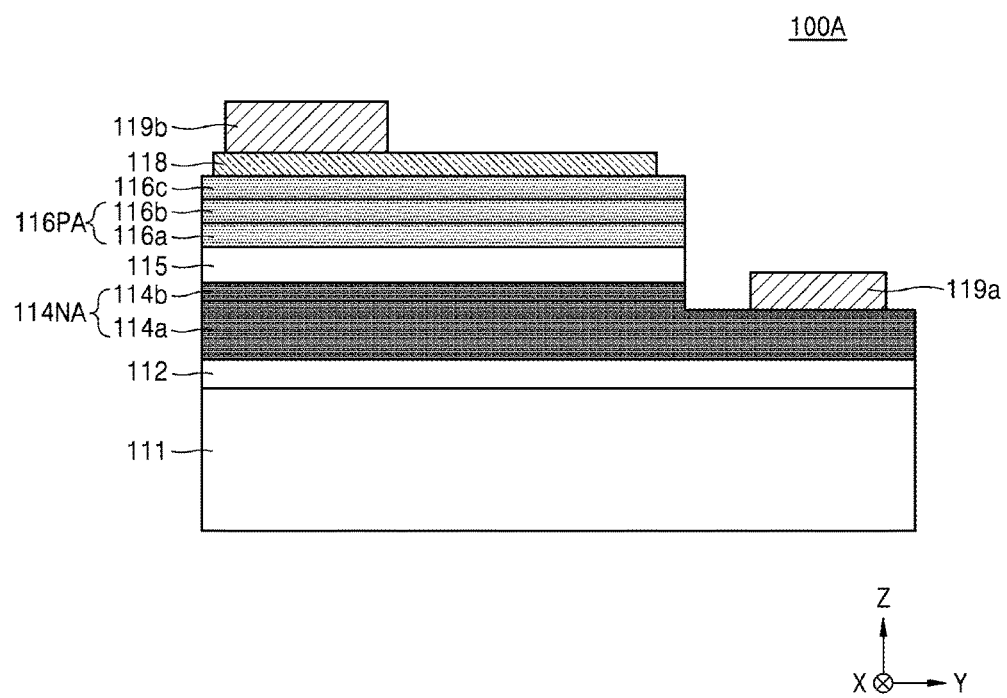

Subsequently, referring to FIG. 5E, a p-type contact layer 116c may be formed on the p-type semiconductor layer 116PA. The p-type contact layer 116c may include a Group III-V semiconductor material into which the second dopant is doped. In some example embodiments, the p-type contact layer 116c may be formed by using an MOCVD process, an MOVPE process, an HVPE process, or an MBE process at a temperature of about 800° C. to about 1100° C. The second dopant may be doped in-situ during the formation of the p-type contact layer 116c.

The p-type contact layer 116c may be an intermediate layer provided for a reliable electrical contact between the p-type semiconductor layer 116PA and an external electrode. The second dopant doped into the p-type contact layer 116c may have a relatively high concentration. For example, a concentration of the second dopant doped into the p-type contact layer 116c may be, for example, about $1\times10^{20}$ atoms/cm$^3$. However, the concentration of the second dopant doped into the p-type contact layer 116c is not limited thereto.

Subsequently, a mesa etching process may be performed on a semiconductor layer stack structure including the n-type semiconductor layer 114NA, the active layer 115, the p-type semiconductor layer 116PA, and the p-type contact layer 116c to expose a surface of the n-type semiconductor layer 114NA. Subsequently, an ohmic contact layer 118 may be formed on the p-type contact layer 116c, and a first electrode 119a and a second electrode 119b may be formed on an exposed surface of the n-type semiconductor layer 114N and the ohmic contact layer 118, respectively, thereby completing the manufacture of the light-emitting device 100A.

In general, the formation of the p-type semiconductor layer 116PA may be performed by growing a Group III-V semiconductor layer into which a p-type dopant is doped in-situ at a desired (and/or alternatively predetermined) concentration, by using an MOCVD process. For example, after a substrate is located in a reaction chamber, a source gas including gallium (Ga), a source gas including nitrogen (N), and a source gas including magnesium (Mg) may be supplied into the reaction chamber so that a GaN layer partially doped with Mg may be grown on the substrate.

When Mg is doped into substitutional sites in a crystal lattice of the GaN layer, holes may be provided into the GaN layer. However, a large portion of a Mg dopant doped into the GaN layer may not occupy the substitutional sites but be located in interstitial sites. For example, only several % of the Mg dopant may be located in the substitutional sites. That is, the Mg dopant may have a very low degree of hole activation. When an in-situ doping content of the Mg dopant is increased to make up for the low degree of hole activation of the Mg dopant, the remaining Mg atoms, which are not located in the substitutional sites, may agglomerate to form Mg grains or Mg hillocks. Thus, the Mg grains or Mg hillocks may act as partial defect regions in the GaN layer. In other words, when the in-situ doping content of the Mg dopant increases, crystal quality of the p-type semiconductor layer may be degraded and thus, luminous efficiency of a light-emitting device may be reduced.

In addition, when the Mg dopant is doped by using an in-situ doping process during a process of forming the p-type semiconductor layer, H atoms generated by pyrolysis of NH$_3$ gas, which is an N precursor, may combine with Mg to form Mg—H complexes. When the Mg—H complexes are contained in the GaN layer, a degree of hole activation (or hole generation efficiency) may be reduced and thus, luminous efficiency of the light-emitting device may be lowered.

However, in the above-described method of manufacturing the light-emitting device 100A, the second dopant may be implanted into the second undoped semiconductor layer 116U by using the second ion implantation process P130, and the second thermal annealing process P140 may be performed to rearrange the second dopant in substitutional sites so that a p-type semiconductor layer 114PA may be formed. Accordingly, unlike in a typical method of manufacturing a p-type semiconductor layer including a process of doping a second dopant in-situ, degradation of crystal quality of the p-type semiconductor layer (e.g., occurrence of Mg hillocks) may be limited and/or prevented. In addition, unlike in the typical method of manufacturing the p-type semiconductor layer including the process of doping the second dopant in-situ, formation of Mg—H complexes may be limited and/or prevented so that a degree of hole activation of the p-type semiconductor layer 114PA may be improved. Accordingly, the p-type semiconductor layer 114PA may have a relatively high dopant content and good crystal quality, and the light-emitting device 100A including the p-type semiconductor layer 114PA may have high luminous efficiency.

Hereinafter, a concentration profile of the second dopant of the light-emitting device 100A described with reference to FIGS. 4 to 5E will be described with reference to FIG. 6.

Figure 6:
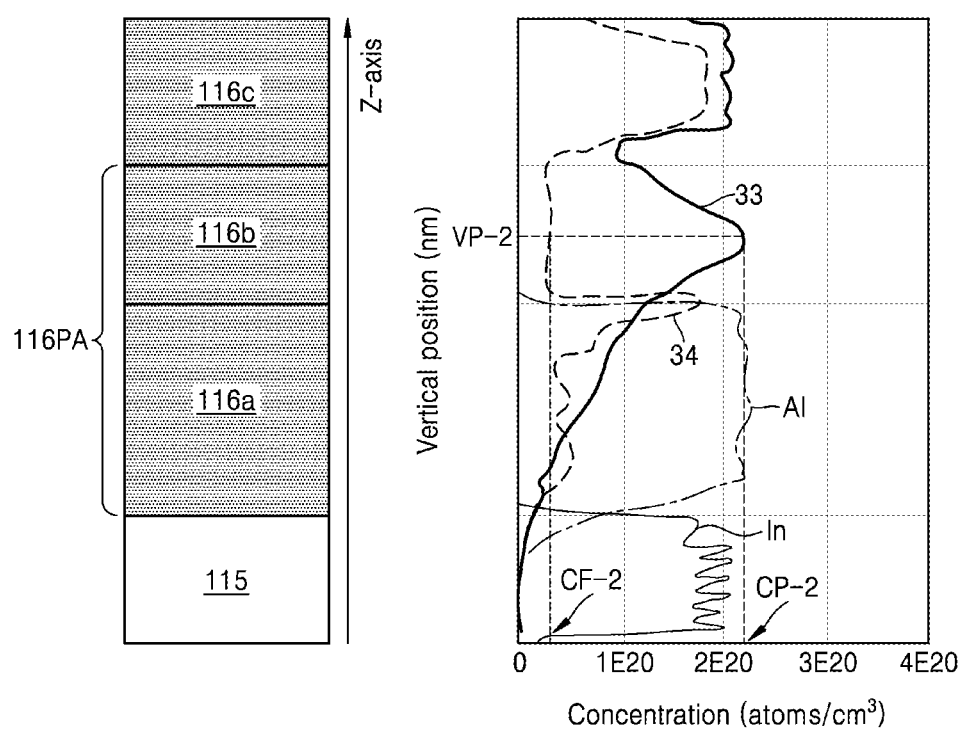
FIG. 6 is a schematic graph of a concentration profile of a second dopant doped into a p-type semiconductor layer according to some example embodiments.

FIG. 6 is a schematic graph of a concentration profile of a second dopant doped into the p-type semiconductor layer 116PA, according to some example embodiments. FIG. 6 shows the concentration profile of the second dopant in the p-type semiconductor layer 116PA relative to a vertical position along a Z direction in Embodiment 33 in which the method described with reference to FIGS. 4 to 5E is used. To make comparisons, FIG. 6 also shows a dotted concentration profile of a second dopant in a p-type semiconductor layer in Comparative example 34 in which a typical in-situ doping process is used. In addition, to make comparisons, FIG. 6 shows concentration profiles of aluminum (Al) atoms and indium (In) atoms.

In Embodiment 33, the concentration profile of the second dopant included in the p-type semiconductor layer 116PA may have a Gaussian distribution. As shown in FIG. 6, the concentration profile of the second dopant according to Embodiment 33 may have a single peak (i.e., a second peak concentration CP-2) in a second vertical position VP-2.

The second peak concentration CP-2 may be greater than about $1 \times 10^{19}$ atoms/cm$^3$. For example, the second peak concentration CP-2 may be greater than about $5 \times 10^{19}$ atoms/cm$^3$ or about $1 \times 10^{20}$ atoms/cm$^3$. FIG. 6 illustrates an example in which the second peak concentration CP-2 is greater than about $2 \times 10^{20}$ atoms/cm$^3$, but the inventive concepts are not limited thereto.

The second vertical position VP-2 may have a variable value in the p-type semiconductor layer 116PA. For example, as shown in FIG. 6, the second vertical position VP-2 may be located near an interface between the fourth semiconductor layer 116b and the third semiconductor layer 116a in the fourth semiconductor layer 116b. In some example embodiments, the second vertical position VP-2 may be located near an interface between the fourth semiconductor layer 116b and the p-type contact layer 116c in the fourth semiconductor layer 116b.

In Comparative example 34, the concentration profile of the second dopant in the p-type semiconductor layer (e.g., a fourth semiconductor layer 116b) may have a uniform distribution over the entire vertical position thereof. The concentration profile of the second dopant in Comparative example 34 may have a second flat concentration CF-2. The second flat concentration CF-2 may be greater than about $1 \times 10^{17}$ atoms/cm$^3$ and lower than $1 \times 10^{20}$ atoms/cm$^3$. For example, the second flat concentration CF-2 may be greater than about $1 \times 10^{18}$ atoms/cm$^3$ and lower than about $5 \times 10^{19}$ atoms/cm$^3$.

As shown in FIG. 6, the second peak concentration CP-2 of the second dopant according to Embodiment 33 may be much greater than the second flat concentration CF-2 of the second dopant according to Comparative example 34.

As described above, when an in-situ doping content of a Mg dopant increases according to Comparative example 34, partial crystal defects (e.g., Mg hillocks) may be formed in a p-type semiconductor layer. Thus, the doping content of the second dopant doped during the in-situ doping process may be limited to the second flat concentration CF-2. Accordingly, in Comparative example 34, the p-type semiconductor layer may include the second dopant in a relatively low content throughout the entire vertical position thereof.

However, in the method described with reference to FIGS. 4 to 5E, after the second undoped semiconductor layer 116U is formed, the p-type semiconductor layer 116PA may be formed by the second ion implantation process P130 and the subsequent second thermal annealing process P140. Thus, in Embodiment 33, the second dopant implanted during the second ion implantation process P130 may have a relatively high second peak concentration CP-2. The second peak concentration CP-2 of the second dopant may be much greater than the second flat concentration CF-2 according to Comparative example 34. Accordingly, a content of the second dopant doped into the p-type semiconductor layer 116PA may be remarkably increased, thereby improving luminous efficiency of the light-emitting device 100A.

Furthermore, the second vertical position VP-2 having the second peak concentration CP-2 may vary according to a kind and structure of a light-emitting device, a stack structure of the p-type semiconductor layer 116PA, and efficiency of injection of carriers from the p-type semiconductor layer 116PA into the active layer 115. Accordingly, flexibility for embodying light-emitting devices having high luminous efficiency may be raised.

In conclusion, in the light-emitting device 100A manufactured by using the method described with reference to FIGS. 4 to 5E, the p-type semiconductor layer 116PA may include the second dopant in a high content and have good crystal quality, and the light-emitting device 100A including the p-type semiconductor layer 116PA may have high luminous efficiency.

Figure 7:
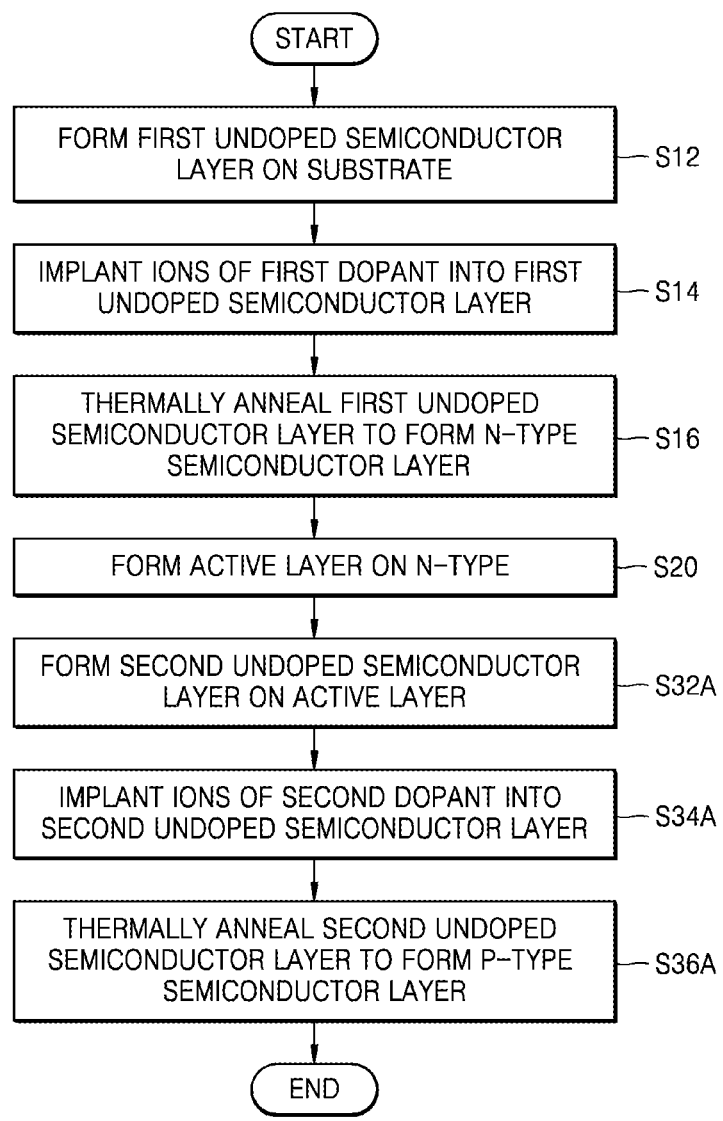
FIG. 7 is a flowchart of a method of manufacturing a light-emitting device according to some example embodiments.

FIG. 7 is a flowchart of a method of manufacturing a light-emitting device according to the first and second layering processes, according to some example embodiments.

FIGS. 8A to 8G are cross-sectional views of sequential process operations of a method of manufacturing a light-emitting device 100B according to the first and second layering processes, according to some example embodiments. In FIGS. 8A to 8G, the same reference numerals are used to denote the same elements as in FIGS. 1 to 6.

Figure 8A:
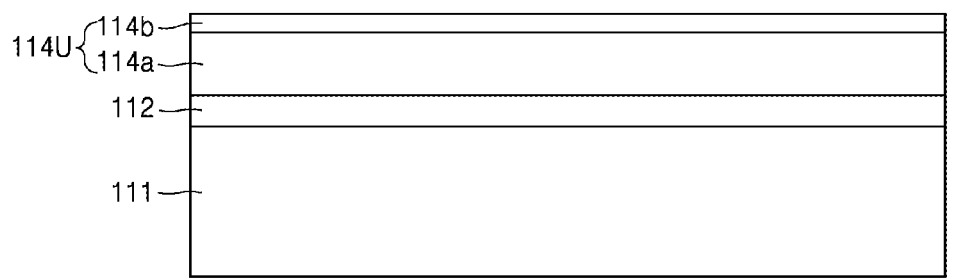
FIGS. 8A-8G are cross-sectional views of sequential process operations of a method of manufacturing a light-emitting device according to some example embodiments.
Figure 8A:
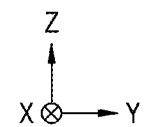

Referring to FIGS. 7 and 8a, in operation S12, a first undoped semiconductor layer 114U may be formed on a substrate 111.

In some example embodiments, a buffer layer 112 may be formed on the substrate 111, and the first undoped semiconductor layer 114U may be formed on the buffer layer 112. The buffer layer 112 and the first undoped semiconductor layer 114U may have similar characteristics to those of the buffer layer 112 and the first undoped semiconductor layer 114U described with reference to FIG. 2A.

Figure 8B:
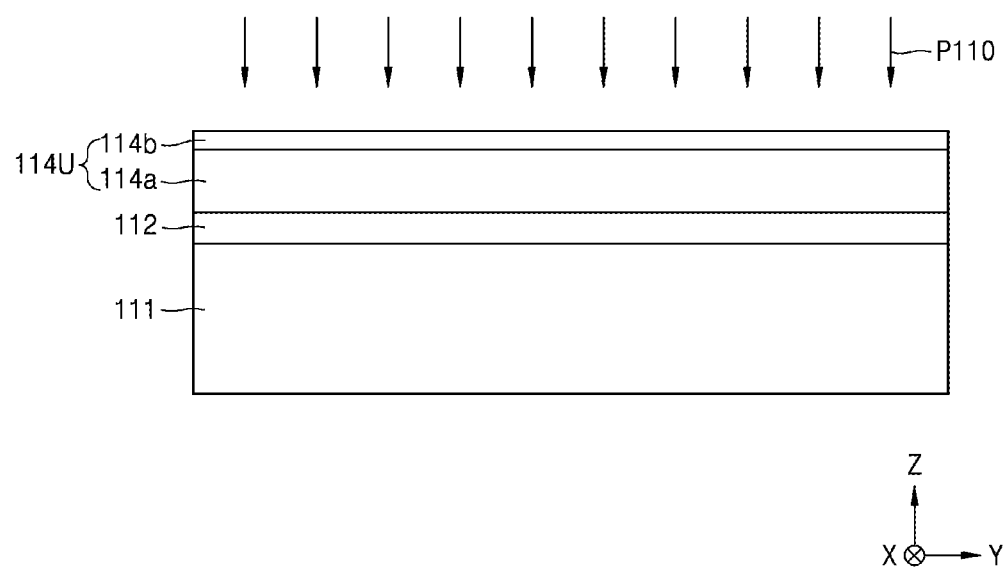

Referring to FIGS. 7 and 8B, in operation S14, ions of a first dopant may be implanted into the first undoped semiconductor layer 114U.

In some example embodiments, a first ion implantation process P110 for implanting the first dopant may be performed on a top surface of the first undoped semiconductor layer 114U. The first dopant and the first ion implantation process P110 may have similar characteristics to those of the first dopant and the first ion implantation process P110 described with reference to FIG. 2B.

Figure 8C:
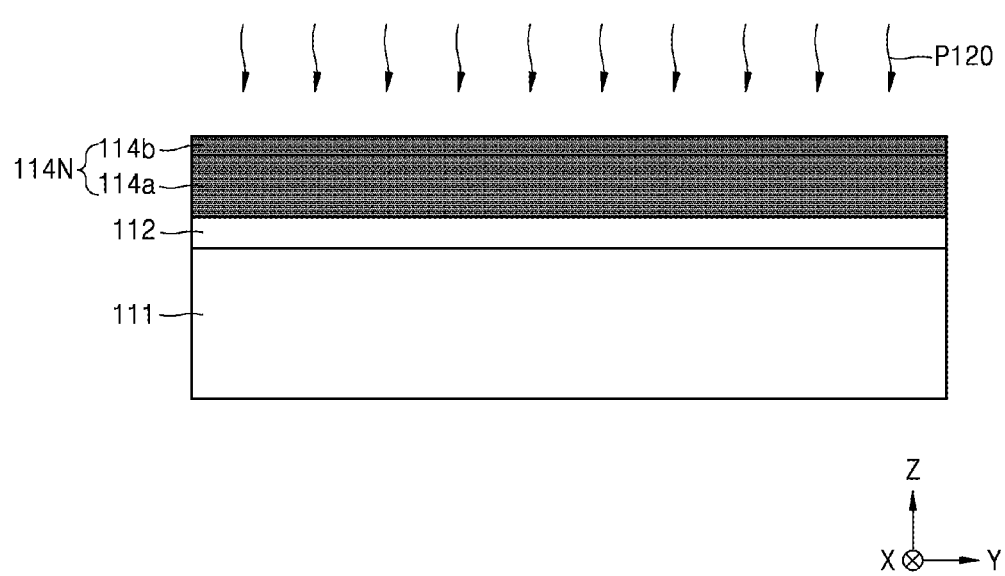

Referring to FIGS. 7 and 8C, in operation S16, the first undoped semiconductor layer 114U (refer to FIG. 8B) may be thermally annealed to form an n-type semiconductor layer 114N.

In some example embodiments, a first thermal annealing process P120 may be performed on the first undoped semiconductor layer 114U into which the first dopant is implanted. The first thermal annealing process P120 may have similar characteristics to those of the first thermal annealing process P120 described with reference to FIG. 2C.

Figure 8D:
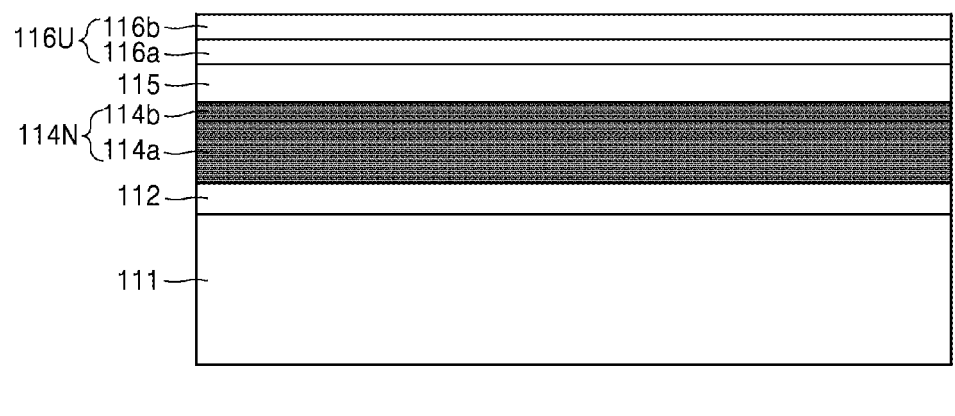

Referring to FIGS. 7 and 8D, in operation S20, an active layer 115 may be formed on the n-type semiconductor layer 114N. The active layer 115 may have similar characteristics to those of the active layer 115 described with reference to FIG. 2D.

Thereafter, in operation S32A, a second undoped semiconductor layer 116U may be formed on the active layer 115.

In some example embodiments, the second undoped semiconductor layer 116U may include third and fourth semiconductor layers 116a and 116b, which are sequentially stacked on the active layer 115. The second undoped semiconductor layer 116U may have similar characteristics to those of the second undoped semiconductor layer 116U described with reference to FIG. 5C.

Figure 8E:
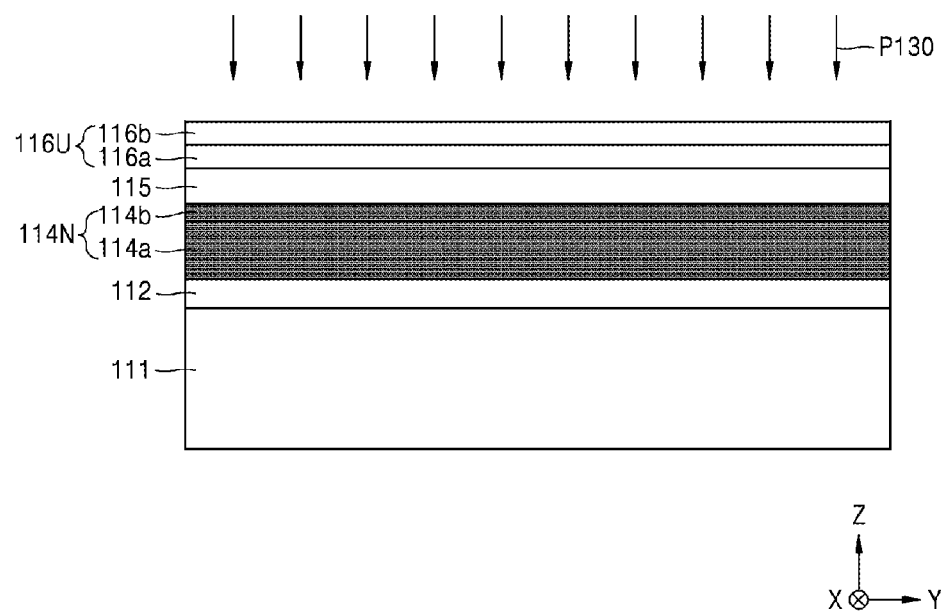

Referring to FIGS. 7 and 8E, in operation S34A, ions of a second dopant may be implanted into the second undoped semiconductor layer 116U.

In some example embodiments, a second ion implantation process P130 for implanting the second dopant may be performed on a top surface of the second undoped semiconductor layer 116U. The second dopant and the second ion implantation process P130 may have similar characteristics to those of the second dopant and the second ion implantation process P130 described with reference to FIG. 5C.

Figure 8F:
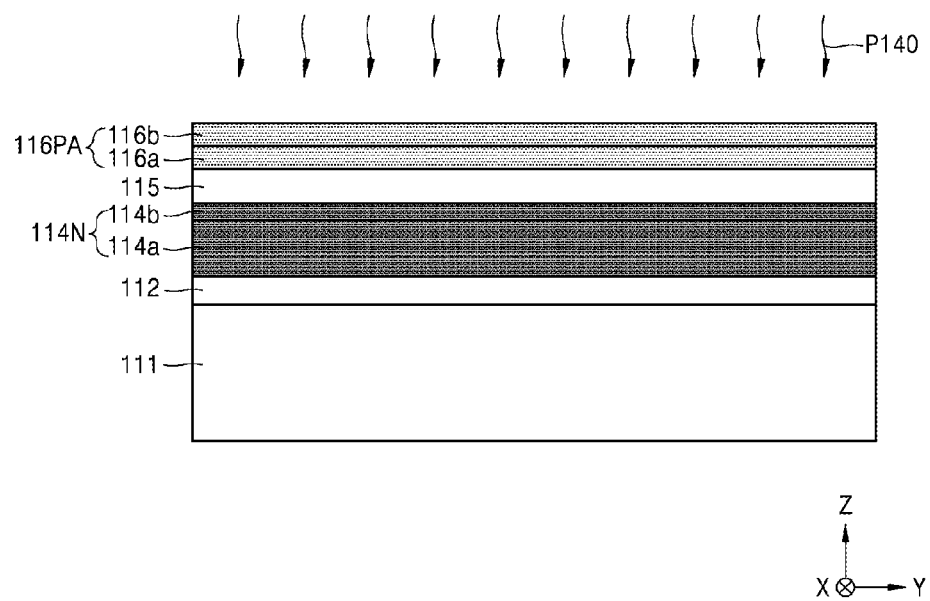

Referring to FIGS. 7 and 8F, in operation S36A, the second undoped semiconductor layer 116U (refer to FIG. 8E) may be thermally annealed to form a p-type semiconductor layer 116PA.

In some example embodiments, a second thermal annealing process P140 may be performed on the second undoped semiconductor layer 116U into which the second dopant is implanted. The second thermal annealing process P140 may have similar characteristics to those of the second thermal annealing process P140 described with reference to FIG. 5D.

Figure 8G:
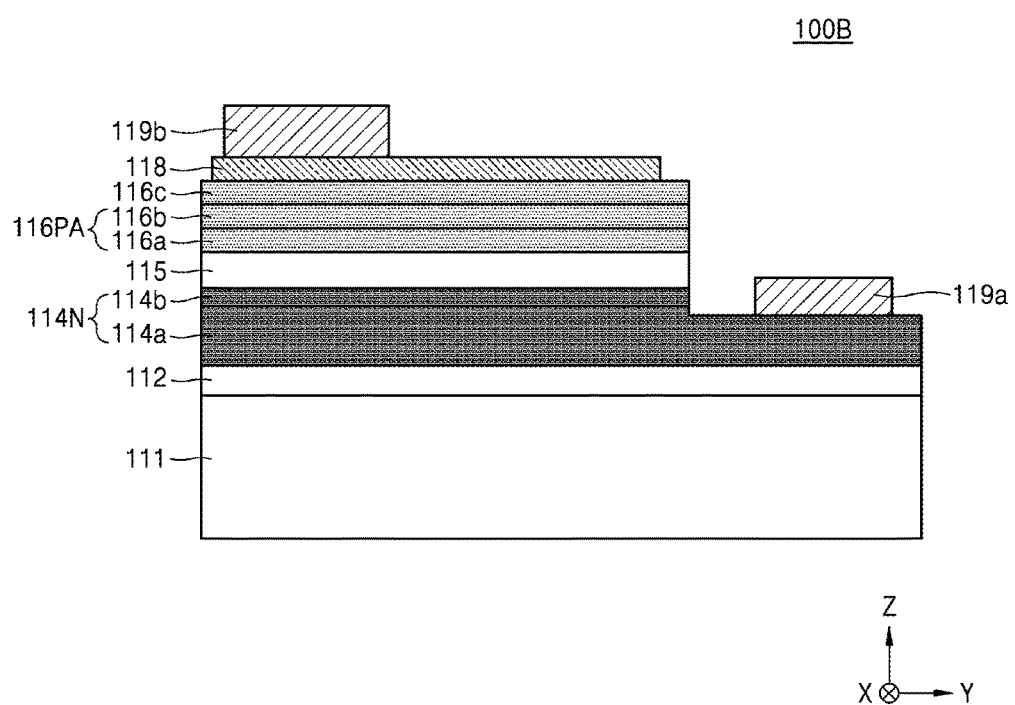

Thereafter, referring to FIG. 8G, a p-type contact layer 116c may be formed on the p-type semiconductor layer 116PA. The p-type contact layer 116c may have similar characteristics to those of the p-type contact layer 116c described with reference to FIG. 5E.

Subsequently, a mesa etching process may be performed on a semiconductor layer stack structure including the n-type semiconductor layer 114N, the active layer 115, the p-type semiconductor layer 116PA, and the p-type contact layer 116c to expose a surface of the n-type semiconductor layer 114N. Subsequently, an ohmic contact layer 118 may be formed on the p-type contact layer 116c, and a first electrode 119a and a second electrode 119b may be formed on an exposed surface of the n-type semiconductor layer 114N and the ohmic contact layer 118, respectively, thereby completing the manufacture of the light-emitting device 100B.

In the above-described method of manufacturing the light-emitting device 100B, after the first undoped semiconductor layer 114U is formed, the n-type semiconductor layer 114N may be formed by using the first ion implantation process P110 and the subsequent first thermal annealing process P120. Also, after the second undoped semiconductor layer 116U is formed, a p-type semiconductor layer 114PA may be formed by using the second ion implantation process P130 and the subsequent second thermal annealing process P140. Accordingly, the n-type semiconductor layer 114N and the p-type semiconductor layer 114PA may have high dopant contents and good crystal quality, and the light-emitting device 100B including the n-type semiconductor layer 114N and the p-type semiconductor layer 114PA may have high luminous efficiency.

Figure 9:
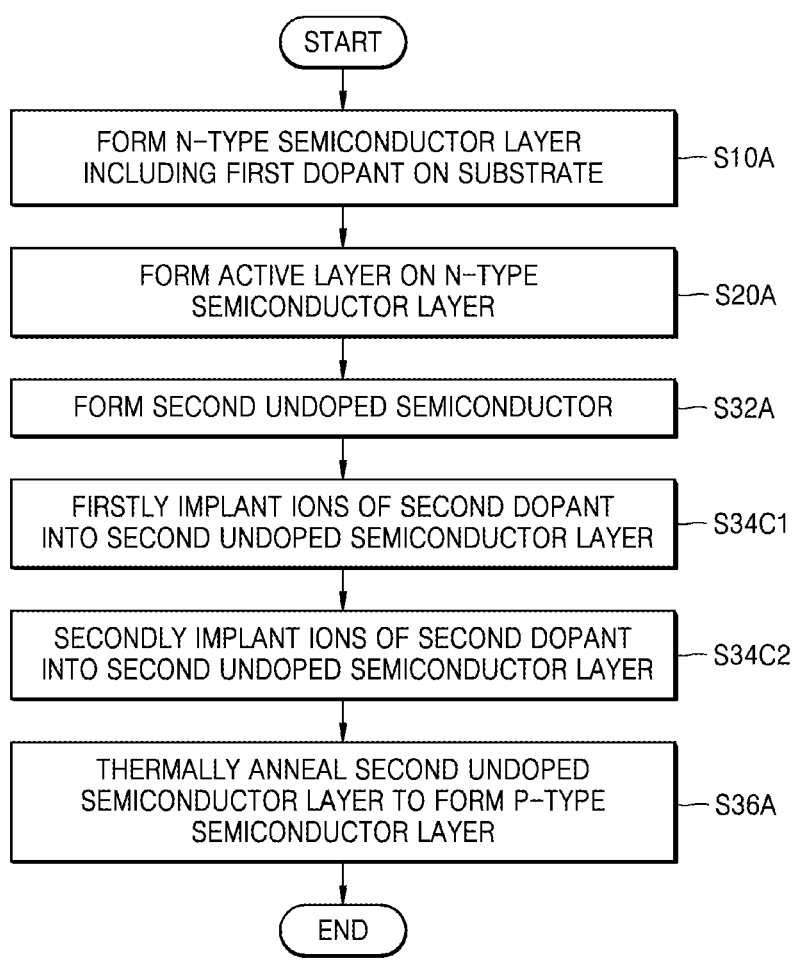
FIG. 9 is a flowchart of a method of manufacturing a light-emitting device according to some example embodiments.

FIG. 9 is a flowchart of a method of manufacturing a light-emitting device according to some example embodiments.

Figure 10A:
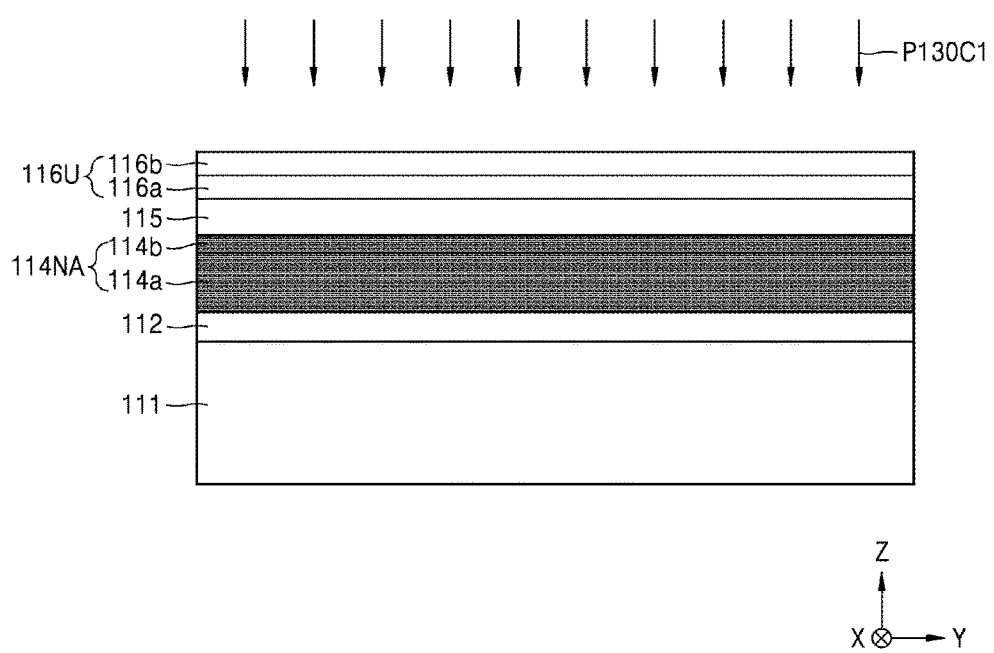
FIGS. 10A-10C are cross-sectional views of sequential process operations of a method of manufacturing a light-emitting device according to some example embodiments.
Figure 10B:
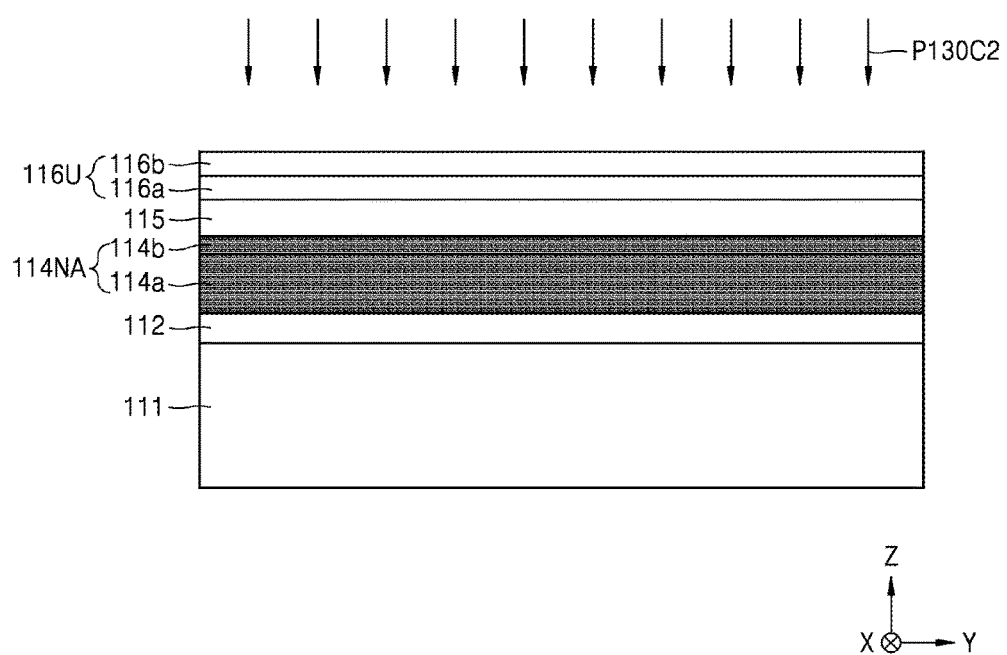
Figure 10C:
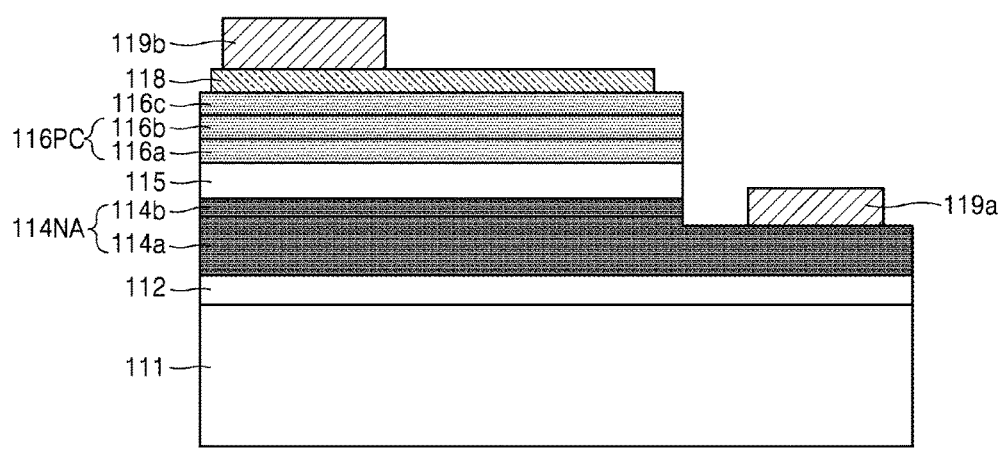
Figure 10C:
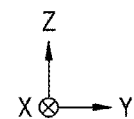

FIGS. 10A to 10C are cross-sectional views of sequential process operations of a method of manufacturing a light-emitting device 100C according to some example embodiments. In FIGS. 10A to 10C, the same reference numerals are used to denote the same elements as in FIGS. 1 to 9.

Referring to FIGS. 9 and 10A, in operation S10A, an n-type semiconductor layer 114NA may be formed on a substrate 111. The n-type semiconductor layer 114NA may include a Group III-V semiconductor material into which a first dopant is doped. The first dopant may be doped in-situ during the formation of the n-type semiconductor layer 114NA. The process of forming the n-type semiconductor layer 114NA may have similar characteristics to those of the process of forming the n-type semiconductor layer 114NA described with reference to FIG. 5A.

Thereafter, in operation 520A, an active layer 115 may be formed on the n-type semiconductor layer 114NA. The active layer 115 may have similar characteristics to those of the active layer 115 described with reference to FIG. 2D.

Thereafter, in operation S32A, a second undoped semiconductor layer 116U may be formed on the active layer 115. The second undoped semiconductor layer 116U may include an undoped Group III-V semiconductor material, and a process of forming the second undoped semiconductor layer 116U may have similar characteristics to those of a process of forming the second undoped semiconductor layer 116U described with reference to FIG. 5B.

Thereafter, in operation S34C1, a second dopant may be firstly implanted into the second undoped semiconductor layer 116U to implement a particular ion implantation process. In some example embodiments, implementing the particular ion implantation process may include implementing a third ion implantation process P130C1 for implanting the second dopant may be performed on a top surface of the second undoped semiconductor layer 116U.

Since the second dopant is implanted into the second undoped semiconductor layer 116U due to the third ion implantation process P130C1, a concentration of the second dopant in the second undoped semiconductor layer 116U may have a Gaussian distribution in a first direction (Z direction in FIG. 10B) that is perpendicular to the top surface of the substrate 111. Here, the Gaussian distribution (or a normal distribution) may have a third peak concentration CP-3 (refer to FIG. 11) in a third vertical position VP-3 (refer to FIG. 11) in the first direction.

Referring to FIGS. 9 and 10B, in operation S34C2, the second dopant may be secondly implanted into the second undoped semiconductor layer 116U to implement a separate ion implantation process.

In some example embodiments, implementing the separate ion implantation process may include implementing a fourth ion implantation process P130C2 for implanting the second dopant may be performed on the top surface of the second undoped semiconductor layer 116U into which the second dopant has been implanted due to the third ion implantation process 130C1.

In some example embodiments, an ion implantation energy and/or ion implantation angle of the fourth ion implantation process P130C2 may be different from an ion implantation energy and/or ion implantation angle of the third ion implantation process P130C1. For example, the second dopant implanted into the second undoped semiconductor layer 116U due to the fourth ion implantation process P130C2 may have a fourth peak concentration CP-4 (refer to FIG. 11) in a fourth vertical position VP-4 (refer to FIG. 11) in the first direction (Z direction in FIG. 10B) that is perpendicular to the top surface of the substrate 111.

In some example embodiments, the third peak concentration CP-3 may be equal to or different from the fourth peak concentration CP-4. However, the inventive concepts are not limited thereto.

In some example embodiments, at least one of the third peak concentration CP-3 and the fourth peak concentration CP-4 of the second dopant implanted into the second undoped semiconductor layer 116U may be, for example, greater than about $1 \times 10^{19}$ atoms/cm$^3$. For example, at least one of the third peak concentration CP-3 and the fourth peak concentration CP-4 of the second dopant may be greater than about $5\times10^{19}$ atoms/cm$^3$ or greater than about $1\times10^{20}$ atoms/cm$^3$. However, the third peak concentration CP-3 and the fourth peak concentration CP-4 of the second dopant according to the inventive concepts are not limited thereto.

Figure 11:
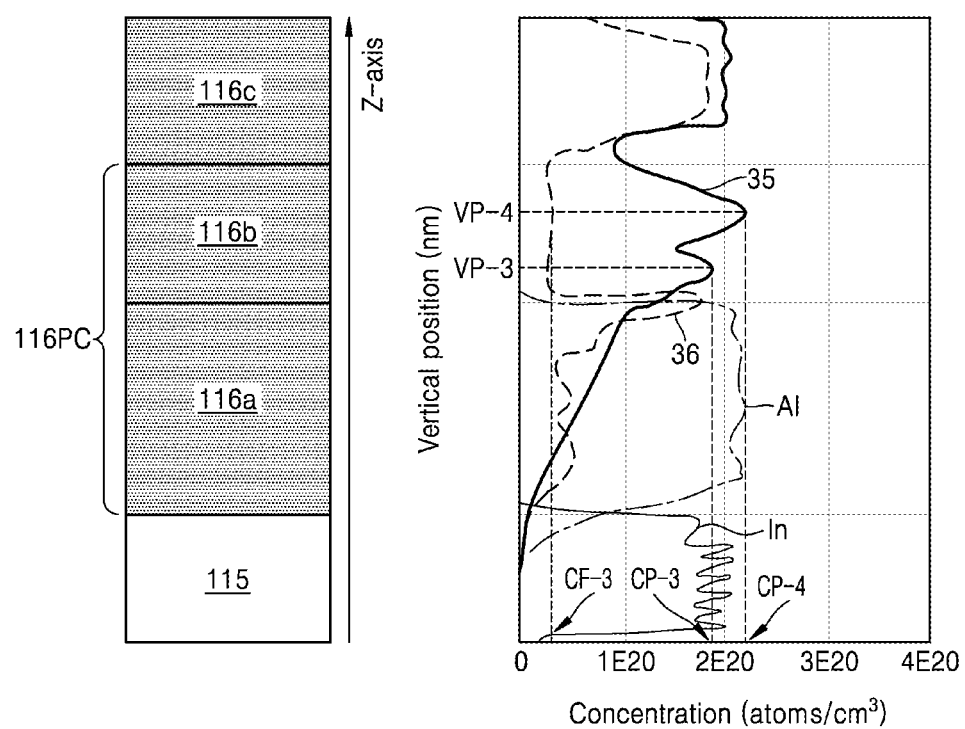
FIG. 11 is a schematic graph of a concentration profile of a second dopant doped into a p-type semiconductor layer according to some example embodiments.

Furthermore, as shown in FIG. 11, a distance between the third vertical position VP-3 and the active layer 115 may be less than a distance between the fourth vertical position VP-4 and the active layer 115, but the inventive concepts are not limited thereto. Unlike shown, a distance between the third vertical position VP-3 and the active layer 115 may be greater than that between the fourth vertical position VP-4 and the active layer 115.

Referring to FIGS. 9 and 10C, in operation S36A, the second undoped semiconductor layer 116U (refer to FIG. 10B) may be thermally annealed to form a p-type semiconductor layer 116PC. The thermal annealing process for forming the p-type semiconductor layer 116PC may have similar characteristics to the second thermal annealing process P140 described with reference to FIG. 5D.

Subsequently, the process described with reference to FIG. 5E may be performed, thereby completing the manufacture of the light-emitting device 100C.

FIGS. 9 to 10C illustrate a method of performing an ion implantation process twice to form the p-type semiconductor layer 116PC, but the inventive concepts are not limited thereto. For example, an ion implantation process may be performed at least three times to form the p-type semiconductor layer 116PC. Respective peak concentrations of the second dopant to be implanted into the p-type semiconductor layer 116PC during respective ion implantation processes may be different or the same. Also, respective vertical positions corresponding to the respective peak concentrations of the second dopant to be implanted into the p-type semiconductor layer 116PC during the respective ion implantation processes may be different.

Hereinafter, a concentration of the second dopant in the light-emitting device 100C described with reference to FIGS. 9 to 10C will be described with reference to FIG. 11.

FIG. 11 is a schematic graph of a concentration profile of the second dopant doped into the p-type semiconductor layer, according to some example embodiments. FIG. 11 shows a concentration profile of the second dopant in the p-type semiconductor layer 116PC relative to a vertical position along a Z direction in Embodiment 35 in which the method described with reference to FIGS. 9 to 10E is used. To make comparisons, FIG. 11 also shows a dotted concentration profile of a second dopant in a p-type semiconductor layer and concentration profiles of aluminum (Al) atoms and indium (In) atoms in Comparative example 36 in which a typical in-situ doping process is used.

In Embodiment 35, the concentration profile of the second dopant in the p-type semiconductor layer 116PC may have a Gaussian distribution having a double peak. Thus, as shown in FIG. 11, the concentration profile of the second dopant in the p-type semiconductor layer 116PC may have the third peak concentration CP-3 in the third vertical position VP-3 and have the fourth peak concentration CP-4 in the fourth vertical position VP-4.

As shown in FIG. 11, the third peak concentration CP-3 and the fourth peak concentration CP-4 obtained in Embodiment 35 may be much greater than a third flat concentration CF-3 obtained in Comparative example 36. Since the concentration profile of the second dopant in the Embodiment 35 has two peak concentrations CP-3 and CP-4 in the p-type semiconductor layer 116PC, the mean concentration of the second dopant may be greater throughout the entire vertical position of the p-type semiconductor layer 116PC as compared with a case in which the concentration profile of the second dopant has a single peak concentration. Accordingly, a content of the second dopant doped into the p-type semiconductor layer 116PC may be remarkably increased, thereby improving luminous efficiency of the light-emitting device 100C.

Figure 12:
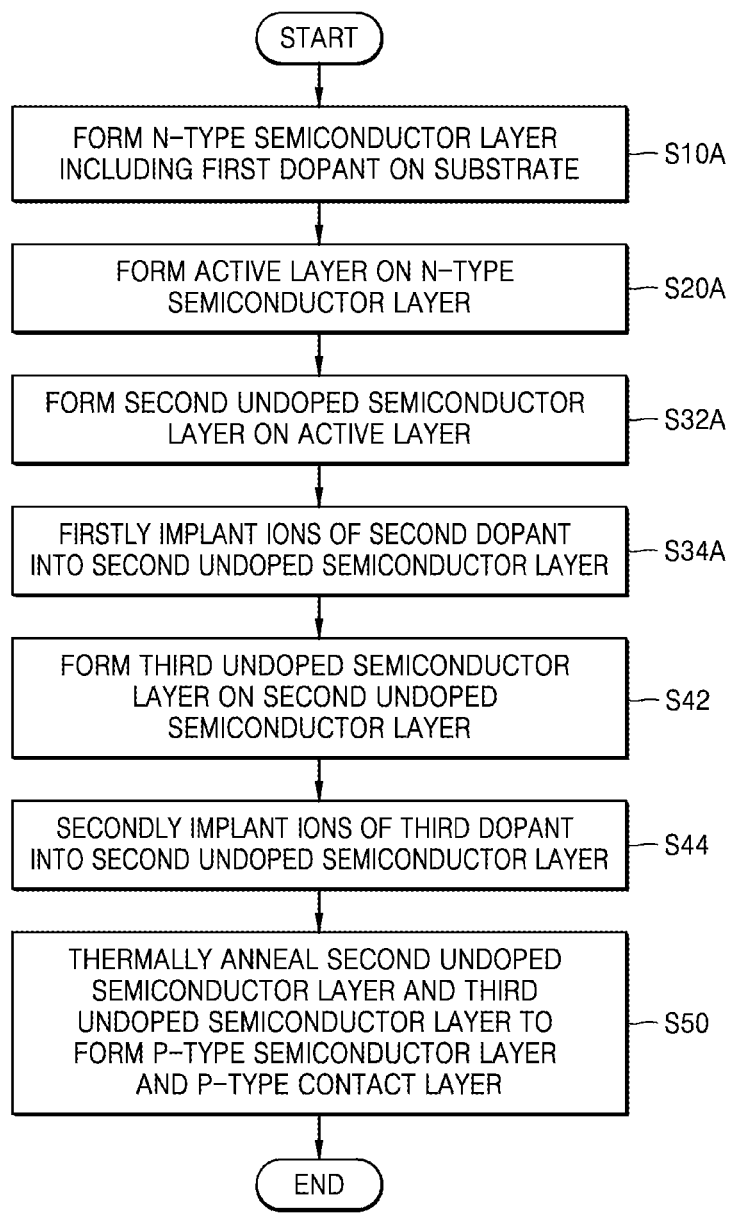
FIG. 12 is a flowchart of a method of manufacturing a light-emitting device according to some example embodiments.

FIG. 12 is a flowchart of a method of manufacturing a light-emitting device according to some example embodiments.

FIGS. 13A to 13E are cross-sectional views of sequential process operations of a method of manufacturing a light-emitting device 100D according to some example embodiments. In FIGS. 13A to 13E, the same reference numerals are used to denote the same elements as in FIGS. 1 to 11.

Figure 13A:
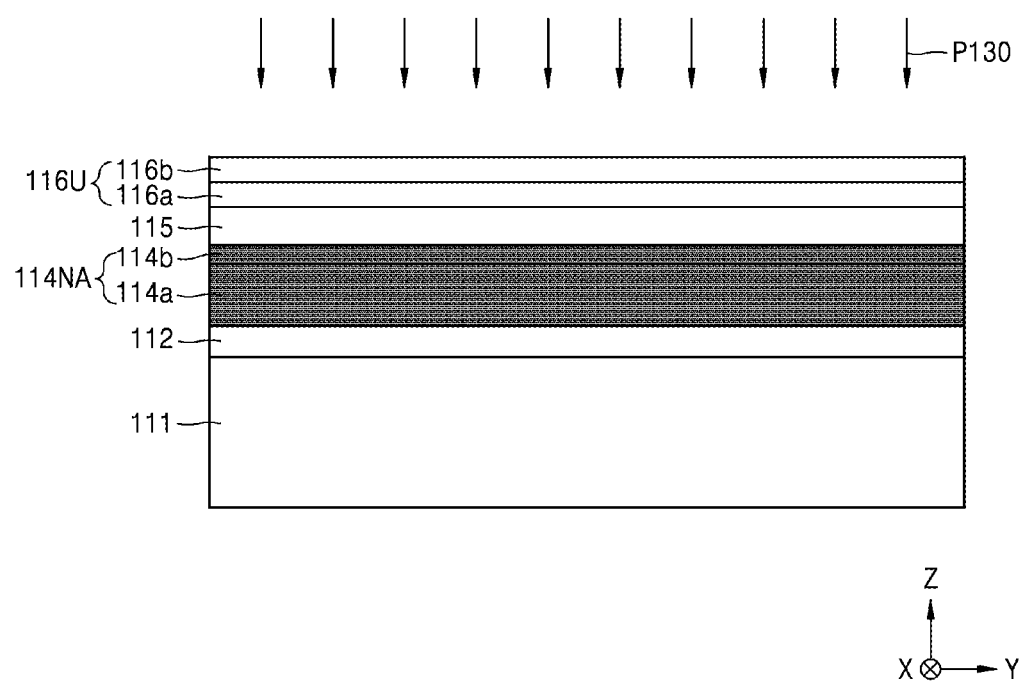
FIGS. 13A-13E are cross-sectional views of sequential process operations of a method of manufacturing a light-emitting device according to some example embodiments.

Referring to FIGS. 12 and 13A, in operation S10A, an n-type semiconductor layer 114NA including a first dopant may be formed on a substrate 111. In operation S20A, an active layer 115 may be formed on the n-type semiconductor layer 114NA. In operation S32A, a second undoped semiconductor layer 116U may be formed on the active layer 115. In operation S34A, a second dopant may be firstly implanted into the second undoped semiconductor layer 116U.

Detailed descriptions of operations S10A to S34A may be inferred from the descriptions provided with reference to FIGS. 5A to 5D.

Figure 13B:
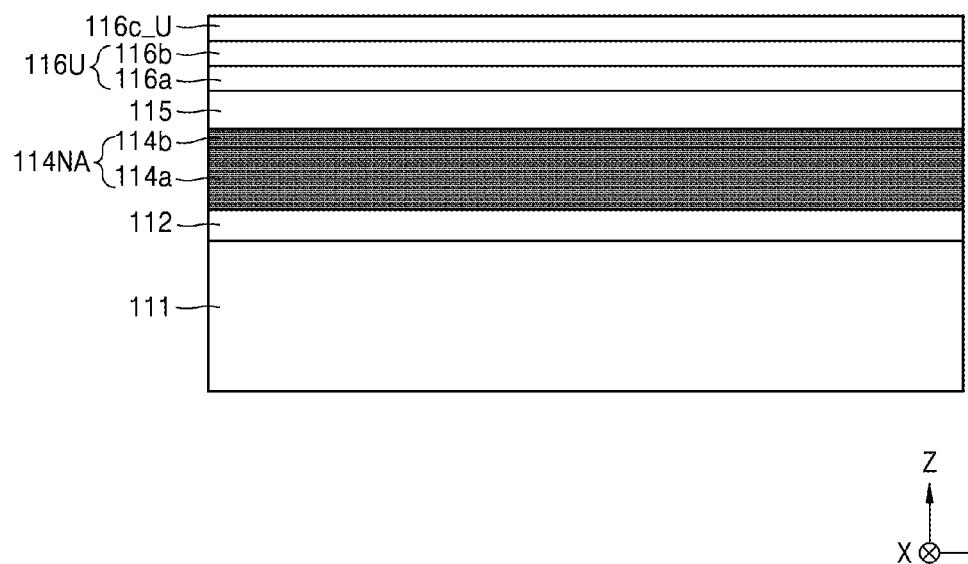

Referring to FIGS. 12 and 13B, in operation S42, a third undoped semiconductor layer 116c_U may be formed on the second undoped semiconductor layer 116U into which the second dopant has been implanted.

In some example embodiments, the third undoped semiconductor layer 116c_U may include an undoped Group III-V semiconductor material. A process of forming the third undoped semiconductor layer 116c_U may have similar characteristics to those of the process of forming the second undoped semiconductor layer 116U described with reference to FIG. 5B.

Figure 13C:
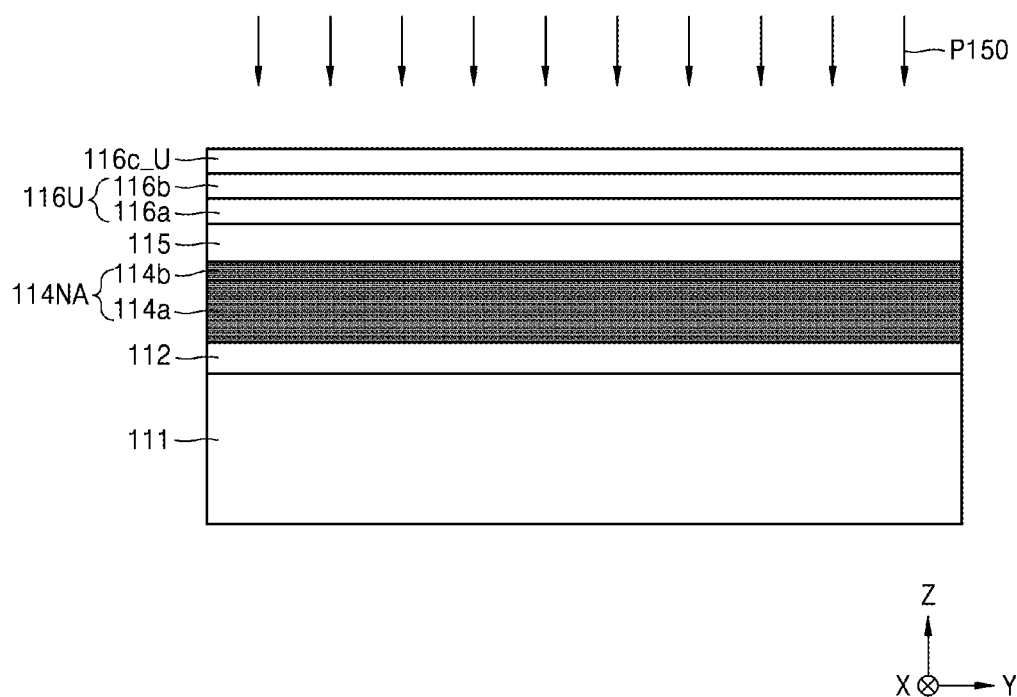

Referring to FIGS. 12 and 13C, in operation S44, a third dopant may be secondly implanted into the third undoped semiconductor layer 116c_U.

In some example embodiments, a fifth ion implantation process P150 for implanting the third dopant may be performed on a top surface of the third undoped semiconductor layer 116c_U.

In some example embodiments, the third dopant may include a p-type dopant, such as magnesium (Mg), beryllium (Be), zinc (Zn), cadmium (Cd), barium (Ba), or calcium (Ca). However, a kind of the third dopant is not limited thereto. The third dopant may include the same material as the second dopant, but is not limited thereto.

Since the third dopant is implanted into the third undoped semiconductor layer 116c_U due to the fifth ion implantation process P150, a concentration of the third dopant in the third undoped semiconductor layer 116c_U may have a Gaussian distribution in the first direction (Z direction in FIG. 13C) that is perpendicular to the top surface of the substrate 111. Here, the Gaussian distribution (or a normal distribution) may have a single peak (i.e., the fifth peak concentration CP-5 (refer to FIG. 14)) in the fifth vertical position VP-5 (refer to FIG. 14) in the first direction.

In some example embodiments, the third dopant may have the fifth peak concentration CP-5 of, for example, greater than about $5\times10^{19}$ atoms/cm$^3$. For example, the third dopant may have the fifth peak concentration CP-5 that is greater than about $1\times10^{20}$ atoms/cm$^3$ or the fifth peak concentration CP-5 that is greater than about 2×1020 atoms/ cm3. However, the fifth peak concentration CP-5 of the third dopant according to the inventive concepts is not limited thereto.

Figure 13D:
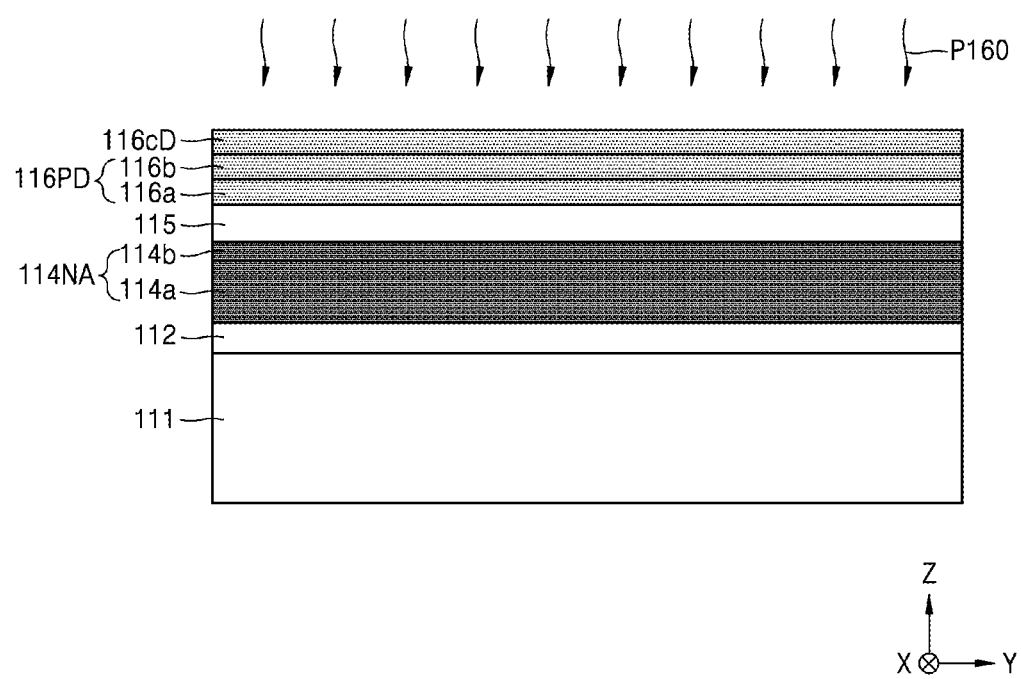

Referring to FIGS. 12 and 13D, in operation S50, the second undoped semiconductor layer 116U (refer to FIG. 13C) and the third undoped semiconductor layer 116c_U (refer to FIG. 13C) may be thermally annealed to form a p-type semiconductor layer 116PD and a p-type contact layer 116cD.

In some example embodiments, a third thermal annealing process P160 may be performed on the second undoped semiconductor layer 116U into which the second dopant has been implanted and the third undoped semiconductor layer 116c_U into which the third dopant has been implanted.

Figure 13E:
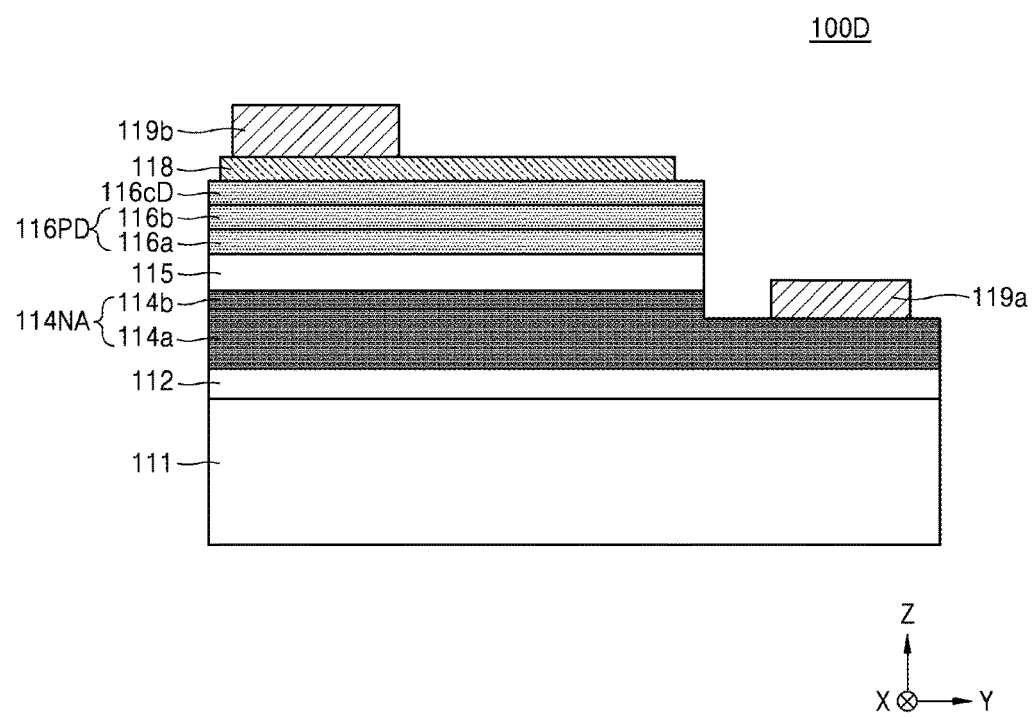

Subsequently, the process described with reference to FIG. 5E may be performed, thereby completing the manufacture of the light-emitting device 100D as shown in FIG. 13E.

Hereinafter, a concentration profile of the third dopant in the light-emitting device 100D described with reference to FIGS. 12 to 13E will be described with reference to FIG. 14.

Figure 14:
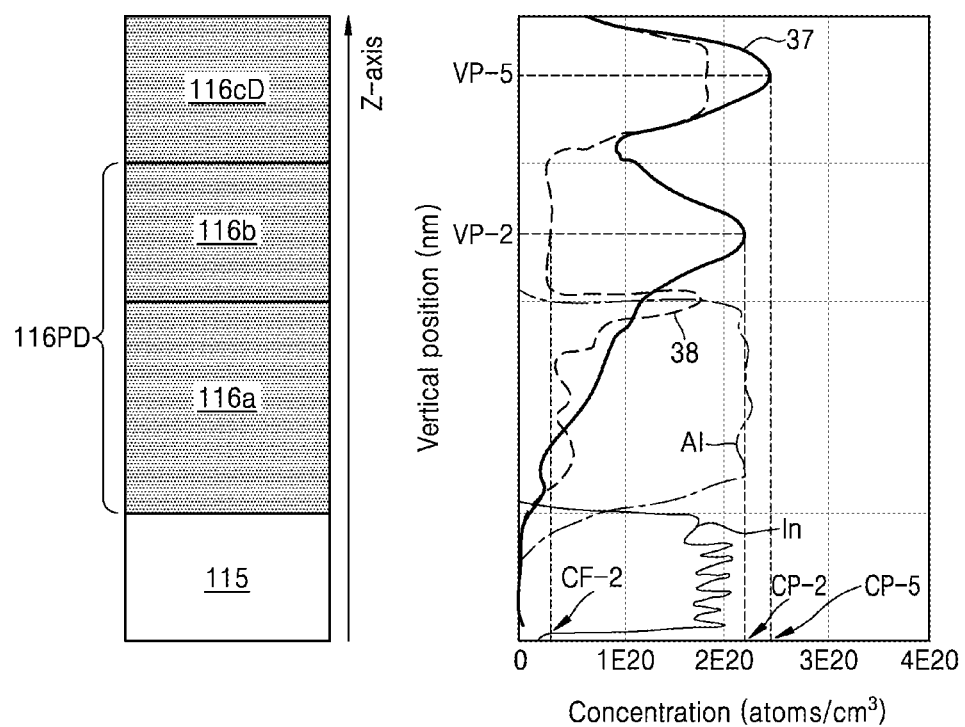
FIG. 14 is a schematic graph of a concentration profile of a third dopant doped into a p-type contact layer according to some example embodiments.

FIG. 14 is a schematic graph of a concentration profile of a third dopant doped into a p-type contact layer 116cD according to some example embodiments. FIG. 14 shows the concentration profile of the third dopant in the p-type contact layer 116cD and the concentration profile of the second dopant in the p-type semiconductor layer 116PD relative to a vertical position along a Z direction in Embodiment 37 in which the method described with reference to FIGS. 12 to 13E is used. To make comparisons, FIG. 14 also shows a dotted concentration profile of a third dopant in a p-type contact layer, a dotted concentration profile of a second dopant in a p-type semiconductor layer, and concentration profiles of aluminum (Al) atoms and indium (In) atoms in Comparative example 38 in which a typical in-situ doping process is used.

In Embodiment 37, the concentration profile of the third dopant in the p-type contact layer 116cD may have a Gaussian distribution. The concentration profile of the third dopant may have a single peak (i.e., the fifth peak concentration CP-5) in the fifth vertical position VP-5. Since the p-type contact layer 116cD includes the third dopant in a relatively high concentration, the resistivity of the p-type contact layer 116cD may be reduced, and the p-type contact layer 116cD having a sufficiently low contact resistance may be provided between the p-type semiconductor layer 116PD and an external electrode (or a second electrode 119b).

Figure 15:
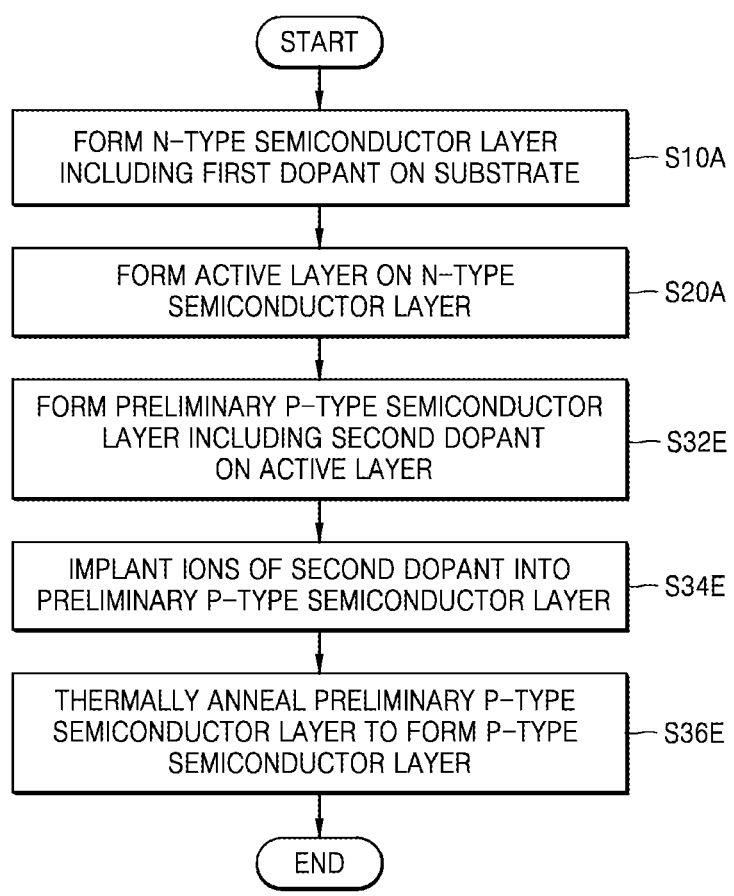
FIG. 15 is a flowchart of a method of manufacturing a light-emitting device according to some example embodiments.

FIG. 15 is a flowchart of a method of manufacturing a light-emitting device according to some example embodiments.

Figure 16A:
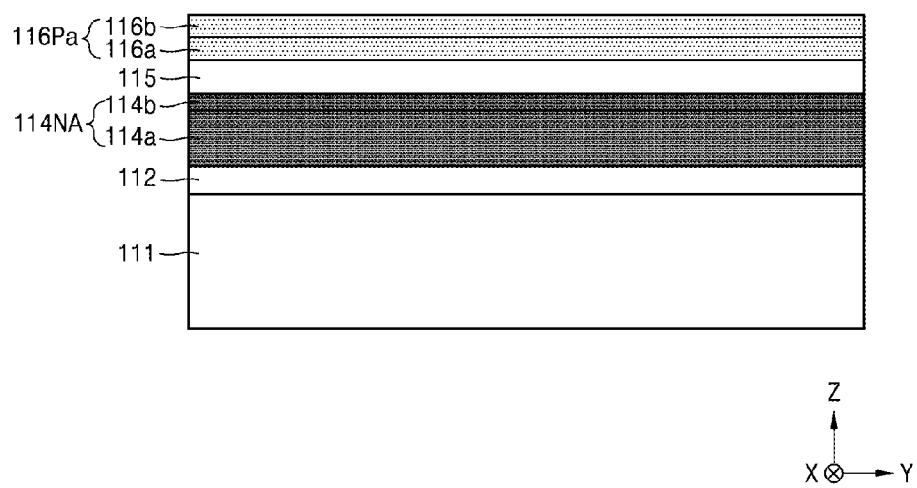
FIGS. 16A-16C are cross-sectional views of sequential process operations of a method of manufacturing a light-emitting device according to some example embodiments.
Figure 16B:
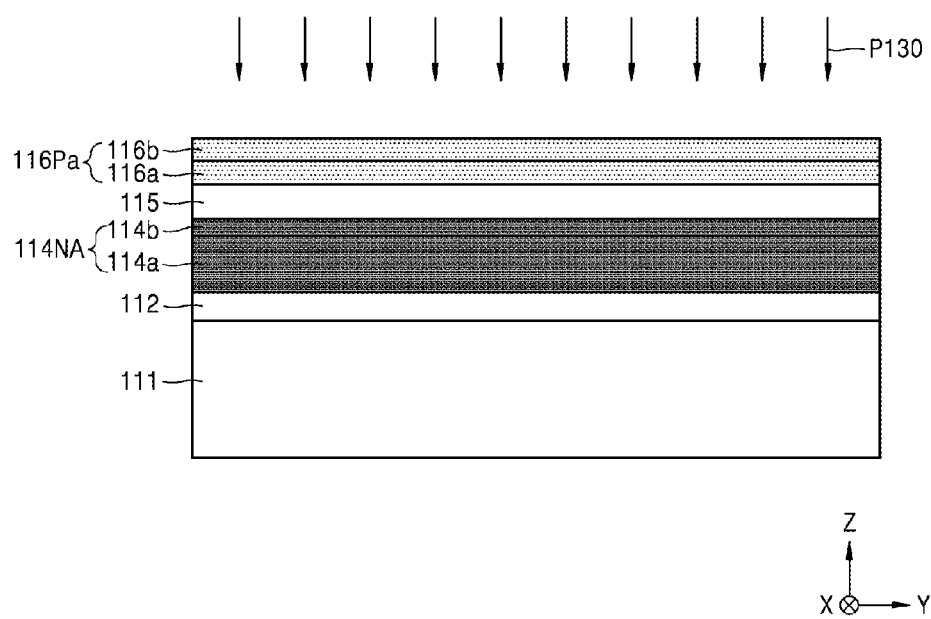
Figure 16C:
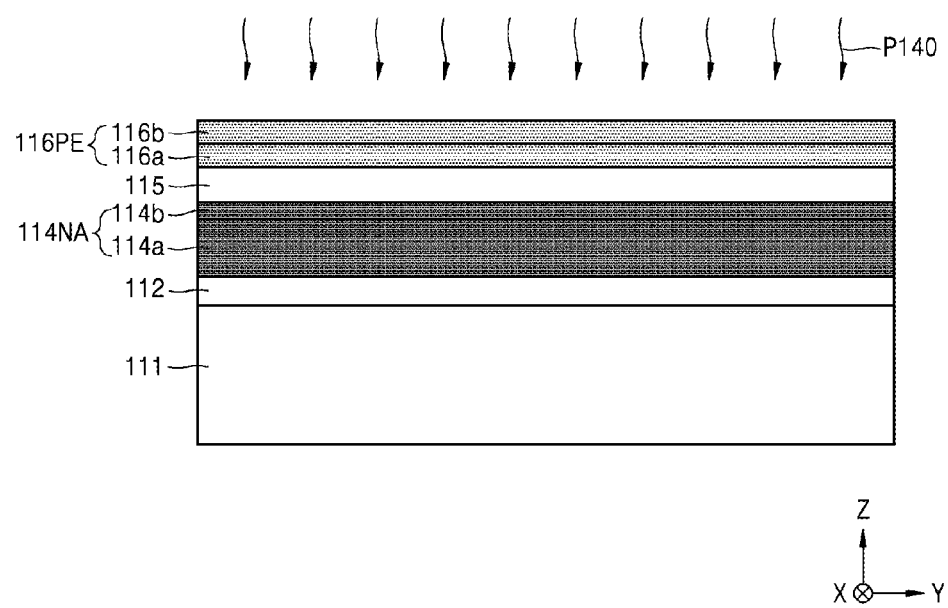

FIGS. 16A to 16C are cross-sectional views of sequential process operations of a method of manufacturing a light-emitting device 100E according to some example embodiments. In FIGS. 16A to 16C, the same reference numerals are used to denote the same elements as in FIGS. 1 to 15.

Referring to FIGS. 15 and 16A, in operation S10A, an n-type semiconductor layer 114NA including a first dopant may be formed on a substrate 111. In operation 520A, an active layer 115 may be formed on the n-type semiconductor layer 114NA.

Thereafter, in operation S32E, a preliminary p-type semiconductor layer 116Pa including a second dopant may be formed on the active layer 115. In some example embodiments, the preliminary p-type semiconductor layer 116Pa may be formed by using an a MOCVD process, a MOVPE process, a HVPE process, or an MBE process at a temperature of about 800° C. to about 1100° C. The second dopant may be doped in-situ during the formation of the preliminary p-type semiconductor layer 116Pa. The preliminary p-type semiconductor layer 116Pa may be a p-type semiconductor layer into which the second dopant is lightly doped.

Referring to FIGS. 15 and 16B, in operation S34E, ions of the second dopant may be implanted into the preliminary p-type semiconductor layer 116Pa.

In some example embodiments, a second ion implantation process P130 for implanting the second dopant may be performed on a top surface of the preliminary p-type semiconductor layer 116Pa. The second dopant and the second ion implantation process P130 may have similar characteristics to those of the second dopant and the second ion implantation process P130 described with reference to FIG. 5C.

Referring to FIGS. 15 and 16C, in operation S36E, the preliminary p-type semiconductor layer 116Pa (refer to FIG. 16B) may be thermally annealed to form a p-type semiconductor layer 116PE.

In some example embodiments, a second thermal annealing process P140 may be performed on the preliminary p-type semiconductor layer 116Pa into which the second dopant has been implanted. The second thermal annealing process P140 may have similar characteristics to those of the second thermal annealing process P140 described with reference to FIG. 5D.

Thereafter, the process described with reference to FIG. 5C may be performed, thereby completing the manufacture of the light-emitting device 100E.

In the light-emitting device 100E according to some example embodiments, ions of the second dopant may be implanted into the preliminary p-type semiconductor layer 116Pa into which the second dopant has been doped in-situ. Accordingly, the content of the second dopant doped into the p-type semiconductor layer 116PE may be remarkably increased, thereby improving luminous efficiency of the light-emitting device 100E.

Figure 17:
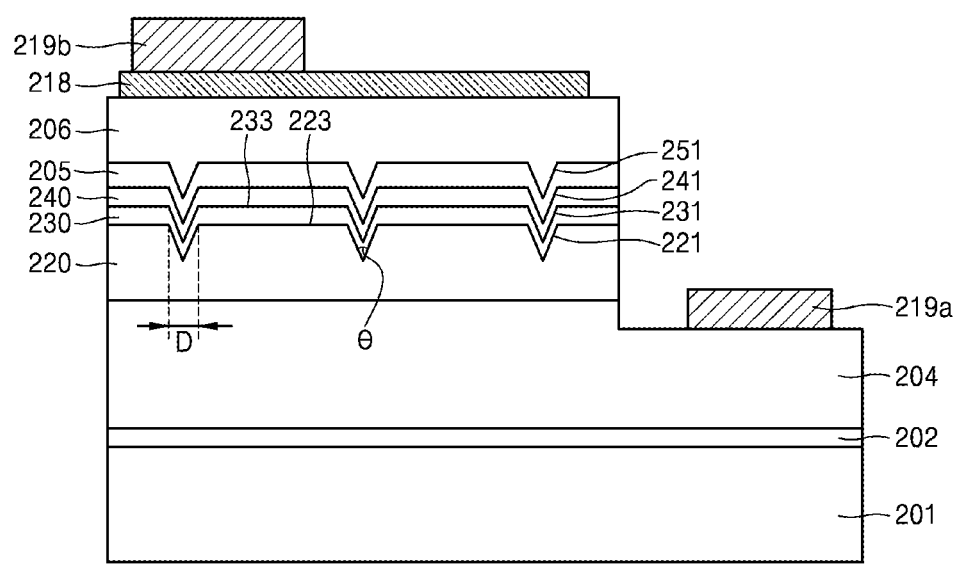
FIG. 17 is a cross-sectional view of a light-emitting device according to some example embodiments.

FIG. 17 is a cross-sectional view of a light-emitting device 200 according to some example embodiments.

Referring to FIG. 17, the light-emitting device 200 may include a substrate 201 and a first-conductivity-type semiconductor layer 204, an active layer 205, and a second-conductivity-type semiconductor layer 206, which are sequentially located on the substrate 201. A buffer layer 202 may be further located between the substrate 201 and the first-conductivity-type semiconductor layer 204.

The first-conductivity-type semiconductor layer 204 may be replaced by one of the n-type semiconductor layers 116N and 116NA described with reference to FIGS. 1 to 16, and the second-conductivity-type semiconductor layer 206 may be replaced by one of the p-type semiconductor layers 116P, 116PA, 116PC, 116PD, and 116PE described with reference to FIGS. 1 to 16.

A V-pit generation layer 220 may be formed on the first-conductivity-type semiconductor layer 204. The V-pit generation layer 220 may be adjacent to the first-conductivity-type semiconductor layer 204. The V-pit generation layer 220 may be a GaN layer or a doped GaN layer.

The V-pit generation layer 220 may have a V-pit density of, for example, about $1 \times 10^8$ cm$^{-2}$ to about $5 \times 10^9$ cm$^{-2}$. The V-pit generation layer 220 may have a thickness of about 200 nm to about 800 nm, and a width D of an entrance of a V-pit 221 may range from about 200 nm to about 800 nm. However, the inventive concepts are not limited thereto. A V-pit 221 generated in the V-pit generation layer 220 may have a vertex angle θ of about 10° to about 90°, for example, about 20° to about 80°. In other words, when the V-pit 221 is cut along a vertical plane passing through a vertex, an angle formed by two inclined planes that meet the vertical plane may be about 10° to about 90°.

The V-pit 221 may have a growth plane (a plane (0001)), which is parallel to a surface of the substrate 201, and a growth plane (a plane (1-101), a plane (11-22), or another inclined crystal plane), which is inclined with respect to the surface of the substrate 201. The V-pit 221 may be formed around a threading dislocation penetrating a light-emitting structure, and limit and/or prevent current from crowding into the threading dislocation.

A film-quality enhancing layer 230 may be located on the V-pit generation layer 220. The film-quality enhancing layer 230 may have a composition of $M_xGa_{1-x}N$. Here, M may be aluminum (Al) or indium (In), and x may satisfy an inequality of $0.01 \leq x \leq 0.3$. For example, x may satisfy a range of $0.02 \leq x \leq 0.08$. Optionally, the film-quality enhancing layer 230 may have a multi-layered structure formed by alternately stacking a gallium nitride (GaN) layer and a $M_xGa_{1-x}N$ layer (here, M is Al or In, and $0.01 \leq x \leq 0.3$). Optionally, the film-quality enhancing layer 230 may be a super-lattice layer including GaN and $M_xGa_{1-x}N$ (here, M is Al or In, and $0.01 \leq x \leq 0.3$). The film-quality enhancing layer 230 may have a thickness of about 20 nm to about 100 nm.

A super-lattice layer 240 may be located adjacent to the active layer 205 on the first-conductivity-type semiconductor layer 204. The super-lattice layer 240 may have a structure formed by repetitively stacking a plurality of $In_xAl_yGa_{1-x-y}N$ layers (here, $0 \leq x < 1$, $0 \leq y < 1$, and $0 \leq x+y < 1$) having different compositions or different dopant contents, and an insulating material layer may be partially formed in the super-lattice layer 240. The super-lattice layer 240 may facilitate diffusion of current and enable uniform emission of light over a large area.

A first electrode 209a may be located on the first-conductivity-type semiconductor layer 204, and an ohmic contact layer 218 and a second electrode 219b may be sequentially located on the second-conductivity-type semiconductor layer 206.

Figure 18A:
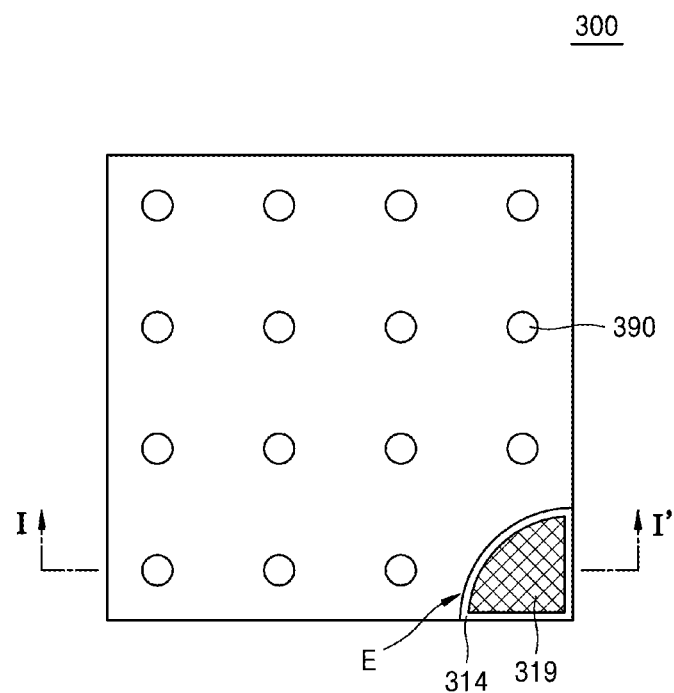
FIG. 18A is a plan view of a light-emitting device according to some example embodiments.
Figure 18B:
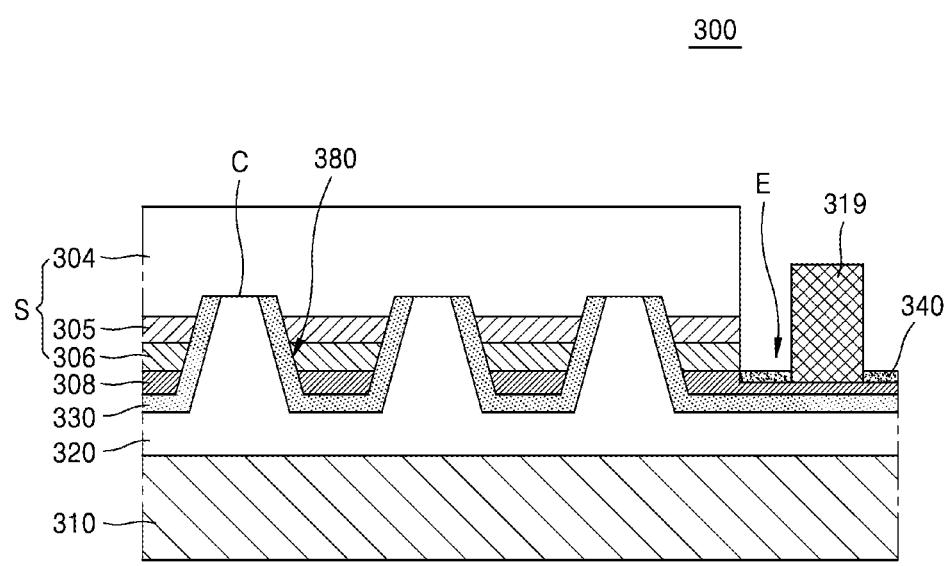
FIG. 18B is a cross-sectional view taken along a line I-I' of FIG. 18A.

FIG. 18A is a plan view of a light-emitting device 300 according to some example embodiments, and FIG. 18B is a cross-sectional view taken along a line I-I' of FIG. 18A.

Referring to FIGS. 18A and 18B, the light-emitting device 300 may have a large-area structure for high-output operations of a lighting apparatus. The light-emitting device 300 may have a structure configured to increase current dispersion efficiency and heat radiation efficiency.

The light-emitting device 300 may include a light-emitting stack structure S, a first electrode 320, an insulating layer 330, a second electrode 308, and a substrate 310. The light-emitting stack structure S may include a first-conductivity-type semiconductor layer 304, an active layer 305, and a second-conductivity-type semiconductor layer 306, which may be sequentially stacked. The first-conductivity-type semiconductor layer 304 may be replaced by one of the n-type semiconductor layers 116N and 116NA described with reference to FIGS. 1 to 16, and the second-conductivity-type semiconductor layer 306 may be replaced by the p-type semiconductor layers 116P, 116PA, 116PC, 116PD, and 116PE described with reference to FIGS. 1 to 16.

The first electrode 320 may be electrically isolated from the second-conductivity-type semiconductor layer 306 and the active layer 305 and include at least one contact hole 380, which extends to at least one partial region of the first-conductivity-type semiconductor layer 304, so that the first electrode 320 may be electrically connected to the first-conductivity-type semiconductor layer 304. The contact hole 380 may extend from an interface of the first electrode 320 through the second electrode 308, the second-conductivity-type semiconductor layer 306, and the active layer 305 into the first-conductivity-type semiconductor layer 304.

The insulating layer 330 may be located on the first electrode 320 and electrically insulate the second electrode 308 from the remaining region except the substrate 310 and the first-conductivity-type semiconductor layer 304. As shown in FIG. 18B, the insulating layer 330 may be formed not only between the first electrode 320 and the second electrode 308 but also on a side surface of the contact hole 380. Thus, the second electrode 308, the second-conductivity-type semiconductor layer 306, and the active layer 305, which are exposed on the side surface of the contact hole 380, may be electrically insulated from the first electrode 320. The insulating layer 330 may be formed by depositing an insulating material, such as $SiO_2$, $SiO_xN_y$, and $Si_xN_y$.

A contact region C of the first-conductivity-type semiconductor layer 304 may be exposed by the contact hole 380, and a partial region of the first electrode 320 may be in contact with the contact region C through the contact hole 380. Thus, the first electrode 320 may be connected to the first-conductivity-type semiconductor layer 304.

The number, shape, and pitch of contact holes 380 and contact diameters (or contact areas) between the contact hole 380 and the first and second-conductivity-type semiconductor layers 304 and 306 may be appropriately controlled to reduce contact resistances (refer to FIG. 18A). The contact holes 380 may be arranged in rows and columns in various shapes to improve the flow of current. The number and contact area of conductive vias may be controlled such that an area of the contact region C ranges from about 0.1% to 20% of a planar area of the light-emitting stack structure S.

As shown in FIG. 18B, the first electrode 308 may provide an electrode forming region E, which extends and is exposed out of the light-emitting stack structure S. The electrode forming region E may include an electrode pad unit 319 configured to connect an external power supply with the first electrode 308. Although FIGS. 18A and 18B illustrate only one electrode forming region E, a plurality of electrode forming regions E may be provided as needed. The electrode forming region E may be formed in one corner of the light-emitting device 300 to increase (and/or maximize) an emission area as shown in FIG. 18A.

An insulating layer 340 serving as an etch stop layer may be located around the electrode pad unit 319. The insulating layer 340 serving as the etch stop layer may be formed in the electrode forming region E after the light-emitting stack structure S is formed and before the second electrode 308 is formed. The insulating layer 340 may function as an etch stop layer during an etching process for forming the electrode forming region E.

Figure 19:
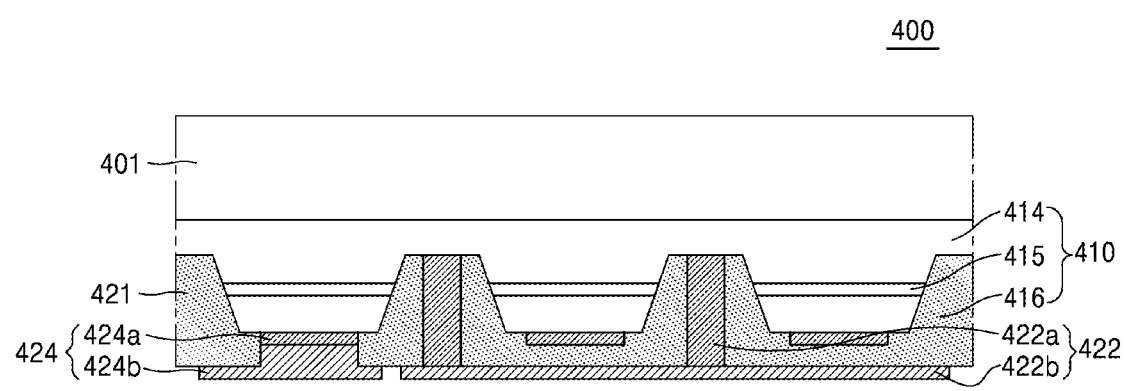
FIG. 19 is a cross-sectional view of a light-emitting device according to some example embodiments.

FIG. 19 is a cross-sectional view of a light-emitting device 400 according to some example embodiments.

Referring to FIG. 19, the light-emitting device 400 may include a semiconductor stack structure 410 formed on a substrate 401, and the semiconductor stack structure 410 may include a first-conductivity-type semiconductor layer 414, an active layer 415, and a second-conductivity-type semiconductor layer 416. The first-conductivity-type semiconductor layer 414 may be replaced by one of the n-type semiconductor layers 116N and 116NA described with reference to FIGS. 1 to 16, and the second-conductivity-type semiconductor layer 416 may be replaced by one of the p-type semiconductor layers 116P, 116PA, 116PC, 116PD, and 116PE described with reference to FIGS. 1 to 16.

The first electrode 422 may include a connection electrode unit 422a and a first electrode pad 422b. The connection electrode unit 422a may penetrate the second-conductivity-type semiconductor layer 416 and the active layer 415 and be connected to the first-conductivity-type semiconductor layer 414. The connection electrode unit 422a may be, for example, a conductive via. The first electrode pad 422b may be connected to the connection electrode unit 422a. The connection electrode unit 422a may be surrounded with an insulating layer 421 and electrically isolated from the active layer 414 and the second-conductivity-type semiconductor layer 416. The connection electrode unit 422a may be located in a region from which the semiconductor stack structure 410 is etched. The number, shape, and pitch of connection electrode units 422a or a contact area between the connection electrode unit 422a and the first-conductivity-type semiconductor layer 414 may be appropriately designed to reduce a contact resistance. Also, the connection electrode units 422a may be arranged in rows and columns on the semiconductor stack structure 410 and improve the flow of current.

A second electrode 424 may include an ohmic contact layer 424a and a second electrode pad 424b, which may be located on the second-conductivity-type semiconductor layer 416.

The first and second electrodes 422 and 424 may be electrically isolated from one another by the insulating layer 421. The insulating layer 421 may include a material including insulation characteristics. For example, the insulating layer 421 may include silicon oxide or silicon nitride, such as $SiO_2$, $SiO_xN_y$, and $Si_xN_y$. When necessary, a light reflection structure may be formed by dispersing a light reflective filler in a light transmissive material. In some example embodiments, the insulating layer 421 may have a multi-layered reflection structure formed by alternately stacking a plurality of insulating layers having different refractive indices. For example, the multi-layered reflection structure may be a distributed bragg reflector (DBR) formed by alternately stacking a first insulating layer having a first reflective index and a second insulating layer having a second reflective index.

Figure 20:
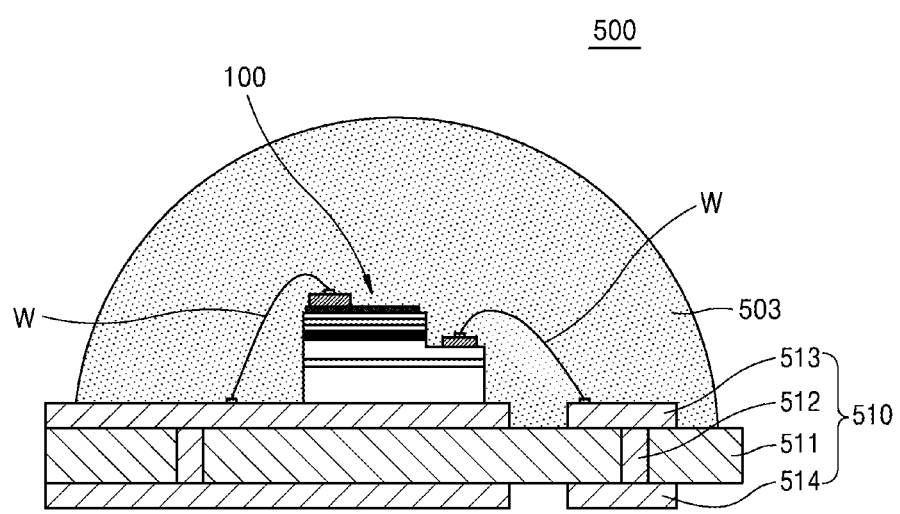
FIG. 20 is a cross-sectional view of a light-emitting device package according to some example embodiments.

FIG. 20 is a cross-sectional view of a light-emitting device package 500 according to some example embodiments.

Referring to FIG. 20, the light-emitting device package 500 may include a light-emitting device 100, a mounting substrate 510, and an encapsulation body 503, which are described with reference to FIGS. 1 to 3. The light-emitting device 100 may be replaced by one of the light-emitting device 100A, 100B, 100C, 100D, and 100E described with reference to FIGS. 4 to 16. The light-emitting device 100 may be mounted on the mounting substrate 510 and electrically connected to the mounting substrate 510 via a wire W. The mounting substrate 510 may include a substrate main body 511, an upper electrode 513, a lower electrode 514, and a through electrode 512 configured to connect the upper electrode 513 with the lower electrode 514. A main body of the mounting substrate 510 may include a resin, a ceramic, or a metal, and the upper electrode 513 or the lower electrode 614 may include a metal, such as Au, Cu, Ag, and Al. For example, the mounting substrate 510 may be a substrate, such as a printed circuit board (PCB), a metal core PCB (MCPCB), a metal-base PCB (MPCB), and a flexible PCB (FPCB), and a structure of the mounting substrate 510 may be applied in various shapes.

The encapsulation body 503 may have a lens structure of which a top surface has a convex dome shape. However, in some embodiments, the encapsulation body 503 may have a lens structure of which a top surface has a convex or concave shape, and control a beam angle of light emitted through the top surface of the encapsulation body 503.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of manufacturing a light-emitting device, the method comprising:
    forming an n-type semiconductor layer, an active layer, and a p-type semiconductor layer on a substrate according to a layering process,
    wherein the layering process includes
        forming the n-type semiconductor layer on the substrate, the n-type semiconductor layer including a first dopant, wherein the first dopant has a first peak concentration in a first vertical position along a first direction, the first direction being perpendicular to a top surface of the substrate,
        forming the active layer on the n-type semiconductor layer, and
        forming the p-type semiconductor layer on the active layer, wherein the forming of the p-type semiconductor layer includes
            forming a second undoped semiconductor layer on the active layer, the second undoped semiconductor layer being free from a second dopant,
            implanting ions of the second dopant into the second undoped semiconductor layer, wherein the second dopant has a second peak concentration in a second vertical position in the first direction perpendicular to the top surface of the substrate, the second peak concentration being greater than about $1 \times 10^{20}$ atoms/cm$^3$, and
            thermally annealing the second undoped semiconductor layer, subsequently to implanting the ions of the second dopant into the second undoped semiconductor layer.

2. The method of claim 1, wherein a concentration of the second dopant in the p-type semiconductor layer has a Gaussian distribution in the first direction perpendicular to the top surface of the substrate.

3. The method of claim 1, wherein the thermally annealing of the second undoped semiconductor layer is performed in a nitrogen atmosphere at a temperature of about 800° C. to about 1100° C.

4. The method of claim 1, further comprising:
    forming a p-type contact layer on the p-type semiconductor layer, the p-type contact layer including a third dopant, wherein the forming of the p-type contact layer includes
        forming a third undoped semiconductor layer on the p-type semiconductor layer, the third undoped semiconductor layer being free from the third dopant,
        implanting ions of the third dopant into the third undoped semiconductor layer, and thermally annealing the third undoped semiconductor layer, subsequently to implanting the ions of the third dopant into the third undoped semiconductor layer.

5. The method of claim 4, wherein the third dopant in the p-type contact layer has a third peak concentration in a third vertical position along the first direction perpendicular to the top surface of the substrate.

6. A method of manufacturing a light-emitting device, the method comprising:

forming an n-type semiconductor layer on a substrate, the n-type semiconductor layer including a first dopant;

forming an active layer on the n-type semiconductor layer; and forming a p-type semiconductor layer on the active layer, the p-type semiconductor layer including a second dopant, the second dopant having a peak concentration in the p-type semiconductor layer, the peak concentration being greater than about $1 \times 10^{20}$ atoms/cm$^3$, and the p-type semiconductor layer including magnesium-hydrogen (Mg—H) complexes at a concentration of about $1 \times 10^{17}$ atoms/cm$^3$ to about $1 \times 10^{18}$ atoms/cm$^3$.

7. The method of claim 6, wherein the peak concentration is located at a first vertical position in the p-type semiconductor layer along a first direction, the first direction being perpendicular to a top surface of the substrate.

8. The method of claim 6, wherein the forming of the p-type semiconductor layer includes, forming a preliminary p-type semiconductor layer on the active layer, the preliminary p-type semiconductor layer including a first concentration of the second dopant;

implanting ions of the second dopant into the preliminary p-type semiconductor layer; and thermally annealing the preliminary p-type semiconductor layer, subsequently to implanting the ions of the second dopant into the preliminary p-type semiconductor layer.

9. The method of claim 8, wherein the forming of the preliminary p-type semiconductor layer includes doping the second dopant, in-situ, into the preliminary p-type semiconductor layer.

10. A method of manufacturing a light-emitting device, the method comprising:

forming an n-type semiconductor layer on a substrate, the n-type semiconductor layer including a first dopant, wherein the first dopant has a first peak concentration in a first vertical position along a first direction, the first direction being perpendicular to a top surface of the substrate;

forming an active layer on the n-type semiconductor layer; and forming a p-type semiconductor layer on the active layer, the forming of the p-type semiconductor layer including forming a second undoped semiconductor layer on the active layer, and implanting ions of a second dopant into the second undoped semiconductor layer, the second undoped semiconductor layer being free from the second dopant prior to implanting the ions of the second dopant wherein the implanting of the ions of the second dopant into the second undoped semiconductor layer includes, implementing a first ion implantation process to implant a first set of ions of the second dopant into the second undoped semiconductor layer, the first ion implantation process including adjusting an ion implantation energy of the first set of ions of the second dopant such that the second dopant has a second peak concentration in a second vertical position along the first direction in the second undoped semiconductor layer, and implementing a second ion implantation process to implant a second set of ions of the second dopant into the second undoped semiconductor layer, subsequently to implementing the first ion implantation process, the second ion implantation process including adjusting an ion implantation energy of the second set of ions of the second dopant such that the second dopant has a third peak concentration in a third vertical position along the first direction in the second undoped semiconductor layer.

11. The method of claim 10, wherein the forming of the p-type semiconductor layer on the active layer further includes thermally annealing the second undoped semiconductor layer, subsequently to implanting the first set of ions and the second set of ions of the second dopant into the second undoped semiconductor layer.

* * * * *